(12) United States Patent
Edahiro

(10) Patent No.: US 7,486,565 B2
(45) Date of Patent: Feb. 3, 2009

(54) SEMICONDUCTOR MEMORY DEVICE WITH MEMORY CELLS EACH INCLUDING A CHARGE ACCUMULATION LAYER AND A CONTROL GATE

(75) Inventor: Toshiaki Edahiro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 48 days.

(21) Appl. No.: 11/613,492

(22) Filed: Dec. 20, 2006

(65) Prior Publication Data

US 2007/0147128 A1    Jun. 28, 2007

(30) Foreign Application Priority Data

Dec. 26, 2005    (JP) .............................. 2005-371741

(51) Int. Cl.
*G11C 16/06* (2006.01)
(52) U.S. Cl. .................. 365/185.24; 365/207; 365/203; 365/210
(58) Field of Classification Search ............ 365/185.24, 365/207, 203, 210
See application file for complete search history.

(56) References Cited

U.S. PATENT DOCUMENTS

| 6,091,629 | A | 7/2000 | Osada et al. |
| 6,724,673 | B2 * | 4/2004 | Covarel et al. ......... 365/189.07 |
| 6,747,892 | B2 * | 6/2004 | Khalid .................. 365/185.03 |
| 6,873,531 | B2 * | 3/2005 | Ahmed et al. ............ 365/49.17 |
| 7,307,878 | B1 * | 12/2007 | Lee et al. ............... 365/185.03 |
| 2005/0036395 | A1 * | 2/2005 | Maejima et al. ............. 365/232 |

FOREIGN PATENT DOCUMENTS

| JP | 2000-90669 | 3/2000 |
| JP | 2002-230989 | 8/2002 |

OTHER PUBLICATIONS

U.S. Appl. No. 11/445,302, filed Jun. 2, 2006, Toshiaki Edahiro.
Toru Tanzawa, et al., "Design of a Sense Circuit for Low-Voltage Flash Memories", IEEE Journal of Solid-State Circuits, vol. 35, No. 10, Oct. 2000, pp. 1415-1421.

* cited by examiner

*Primary Examiner*—Connie C Yoha
(74) *Attorney, Agent, or Firm*—Oblon, Spivak, McClelland, Maier & Neustadt, P.C.

(57) ABSTRACT

A semiconductor memory device includes a memory cell array, a bit line, a precharge circuit and a first sense amplifier. The memory cell array includes memory cells. The bit line connects commonly the memory cells in the same column. The precharge circuit applies a precharge potential to the bit line in reading data. The first sense amplifier amplifies data read onto the bit line. The precharge circuit determines the data read on the bit line using as a reference potential the precharge potential applied to the bit line by the precharge circuit.

18 Claims, 25 Drawing Sheets

FIG. 2  Memory cell array

Erase operation

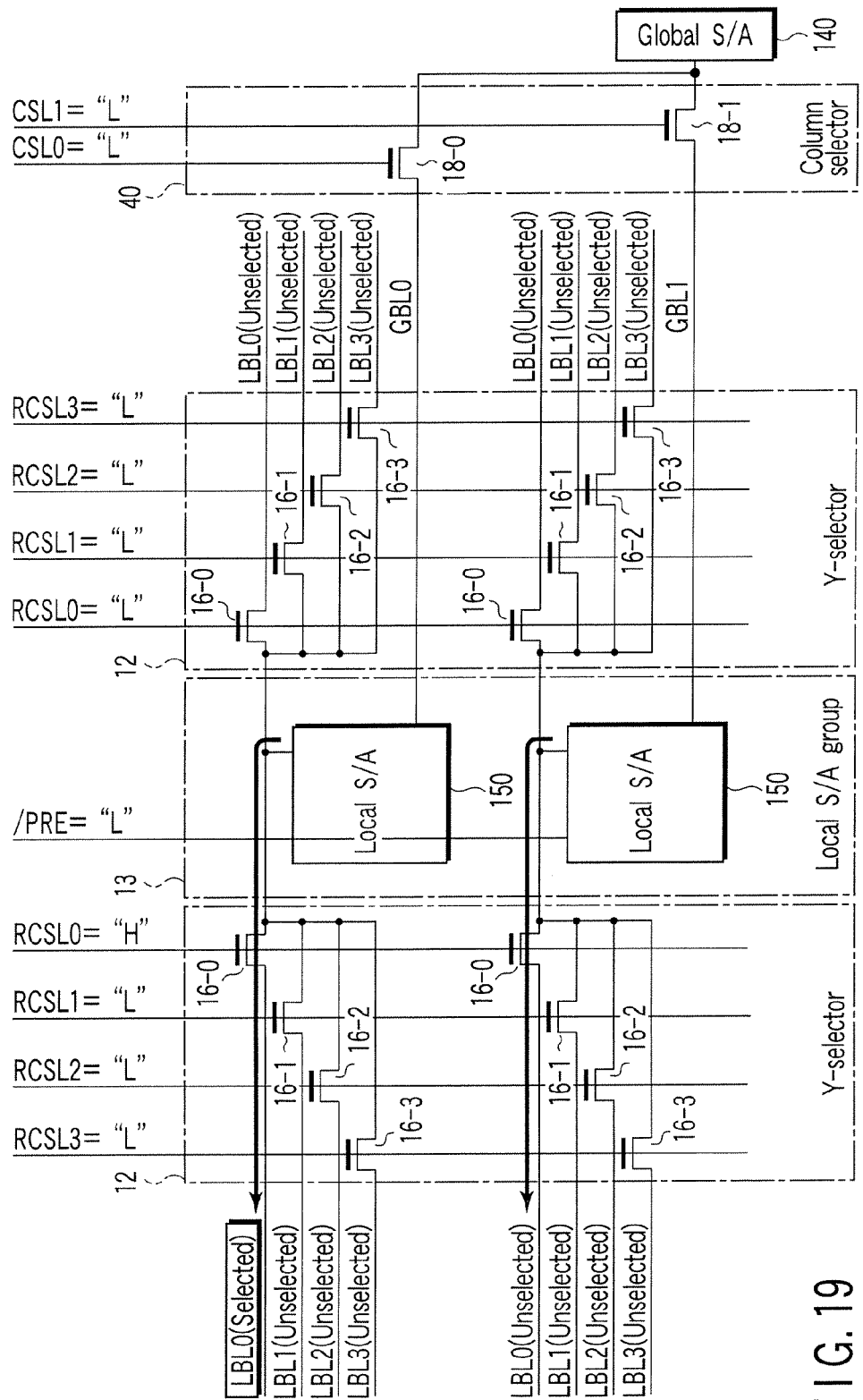
F I G. 19

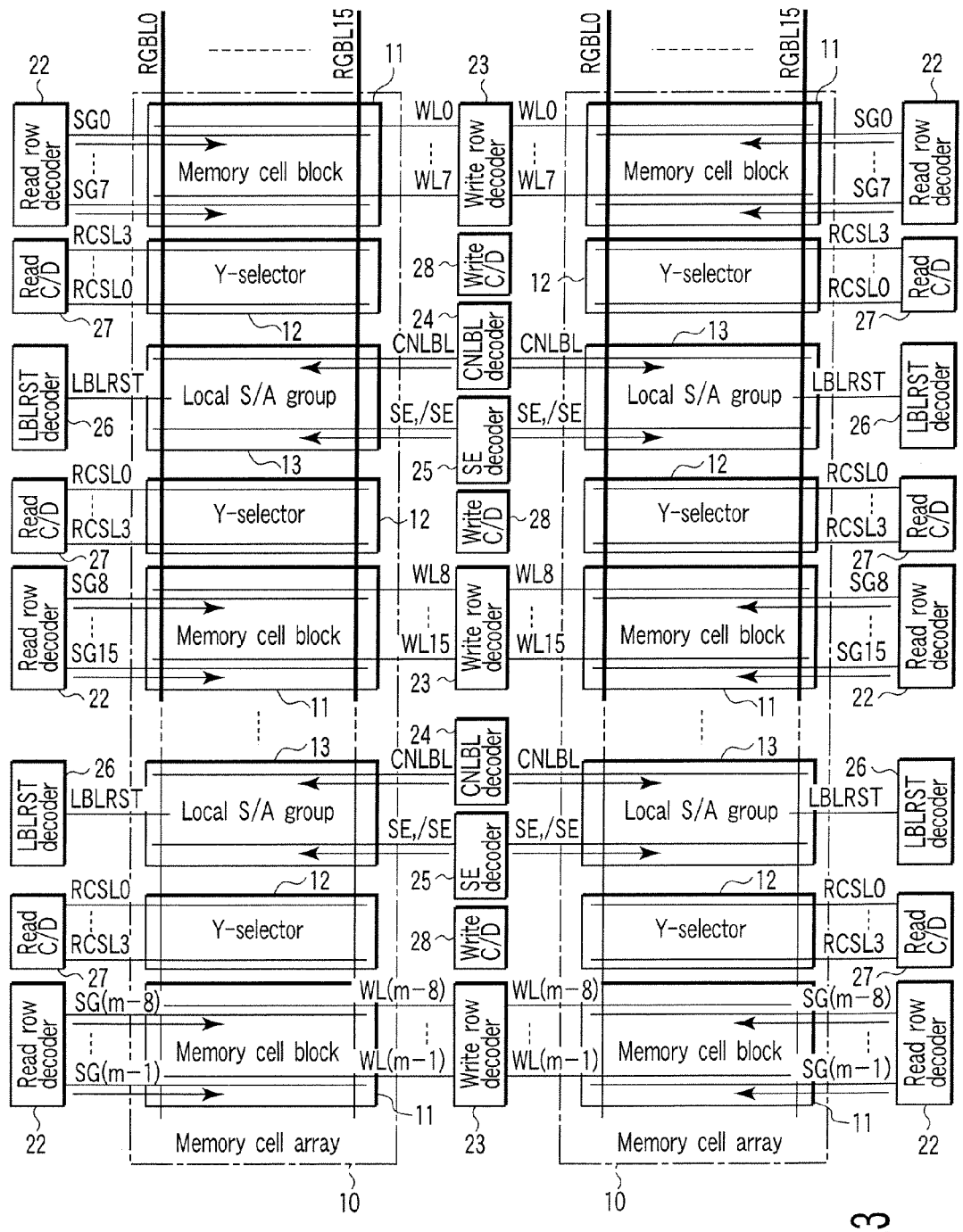
F I G. 23

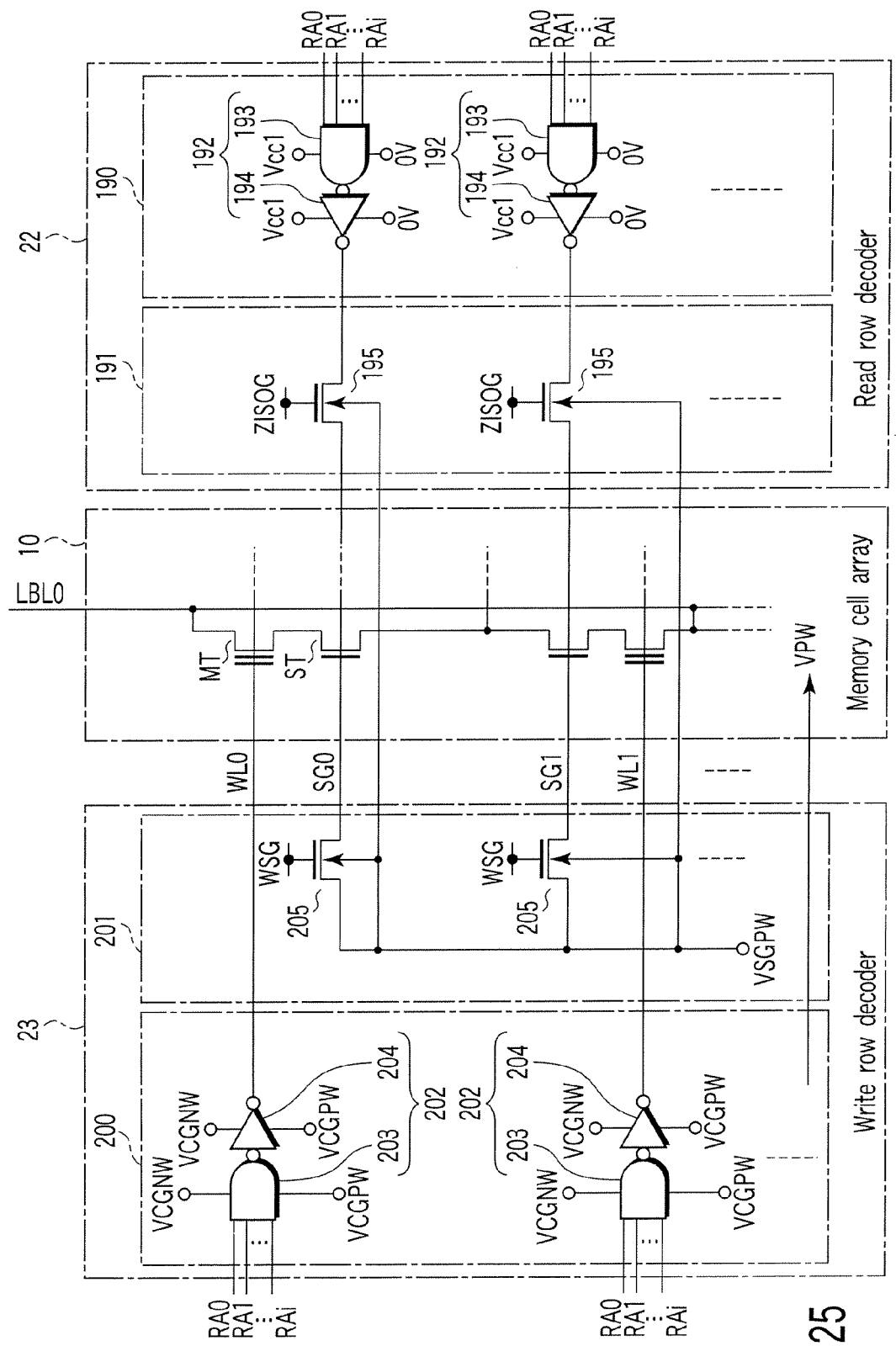
F I G. 25

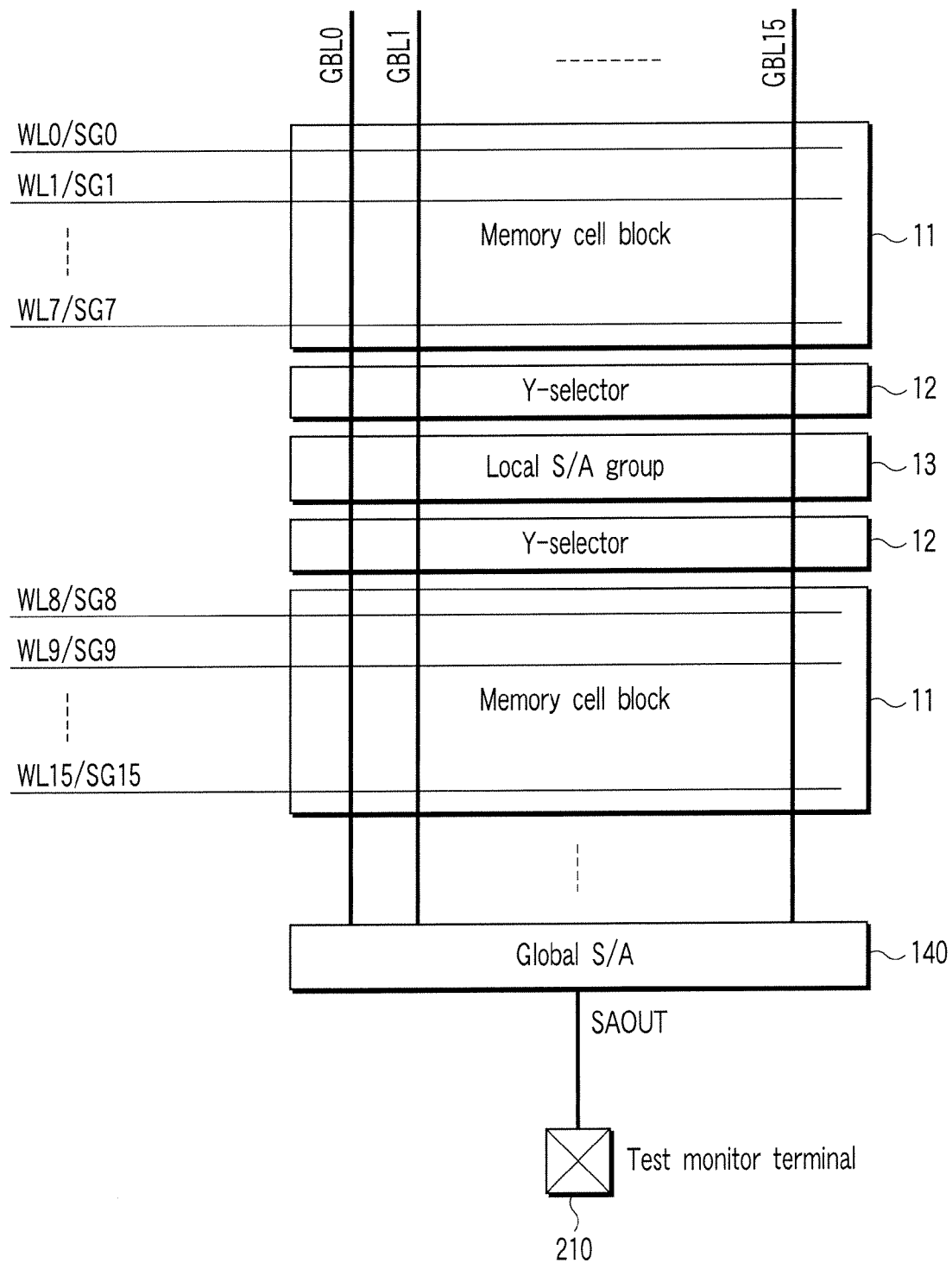
F I G. 26

Memory cell array

SEMICONDUCTOR MEMORY DEVICE WITH MEMORY CELLS EACH INCLUDING A CHARGE ACCUMULATION LAYER AND A CONTROL GATE

CROSS-REFERENCE TO RELATED APPLICATIONS

This application is based upon and claims the benefit of priority from prior Japanese Patent Application No. 2005-371741, filed Dec. 26, 2005, the entire contents of which are incorporated herein by reference.

BACKGROUND OF THE INVENTION

1. Field of the Invention

This invention relates to a semiconductor memory device with memory cells each including a charge accumulation layer and a control gate and a method of reading data in the memory device. More particularly, this invention relates to a nonvolatile semiconductor memory device including MOS transistors each having a floating gate and a control gate.

2. Description of the Related Art

In recent years, semiconductor memory devices, particularly memory cells for holding data, have been miniaturized further. As the size of a memory cell decreases, the cell current flowing through the bit line in reading data decreases. This causes a problem: the data read time becomes longer.

To solve this problem, various sense amplifiers capable of a high-speed operation even if the cell current decreases have been disclosed in, for example, Jpn. Pat. Appln. KOKAI Publication No. 2002-230989, Jpn. Pat. Appln. KOKAI Publication No. 2000-090669, and U.S. Pat. No. 6,091,629. However, each of the sense amplifiers compares a reference current with the cell current, thereby amplifying the data. Accordingly, a reference current generator circuit is required, which causes a problem: the size of the semiconductor memory becomes larger.

BRIEF SUMMARY OF THE INVENTION

A semiconductor memory device according to an aspect of the present invention includes a memory cell array in which memory cells are arranged;

a bit line which connects commonly the memory cells in the same column;

a precharge circuit which applies a precharge potential to the bit line in reading data; and a first sense amplifier which amplifies data read onto the bit line and which determines the data read on the bit line using as a reference potential the precharge potential applied to the bit line by the precharge circuit.

A method of reading data in a semiconductor memory device according to an aspect of the present invention includes connecting a first bit line and a second bit line to each other with a switch element;

precharging the first and second bit lines with a precharge circuit;

after the precharging, connecting the first and second bit lines to each other with the switch element to equalize the potentials of the first and second bit lines;

disconnecting the first and second bit lines from each other with the switch element;

reading data from a memory cell onto the second bit line, with the first and second bit lines being disconnected; and after reading the data, amplifying the potential of the second bit line using the potential of the first bit line as a reference.

BRIEF DESCRIPTION OF THE SEVERAL VIEWS OF THE DRAWING

FIG. 19 is a circuit diagram of the Y-selector, local sense amplifier group, column selector, and global sense amplifier included in the 2Tr flash memory of the second embodiment, showing a precharge operation;

FIG. 23 is a block diagram of a part of a 2Tr flash memory according to a fourth embodiment of the present invention;

FIG. 25 is a circuit diagram of the memory cell array, read row decoder, and write row decoder included in the 2Tr flash memory according to the fourth embodiment;

FIG. 26 is a block diagram of a part of the memory cell array included in a 2Tr flash memory according to a fifth embodiment of the present invention;

DETAILED DESCRIPTION OF THE INVENTION

Figure 1:
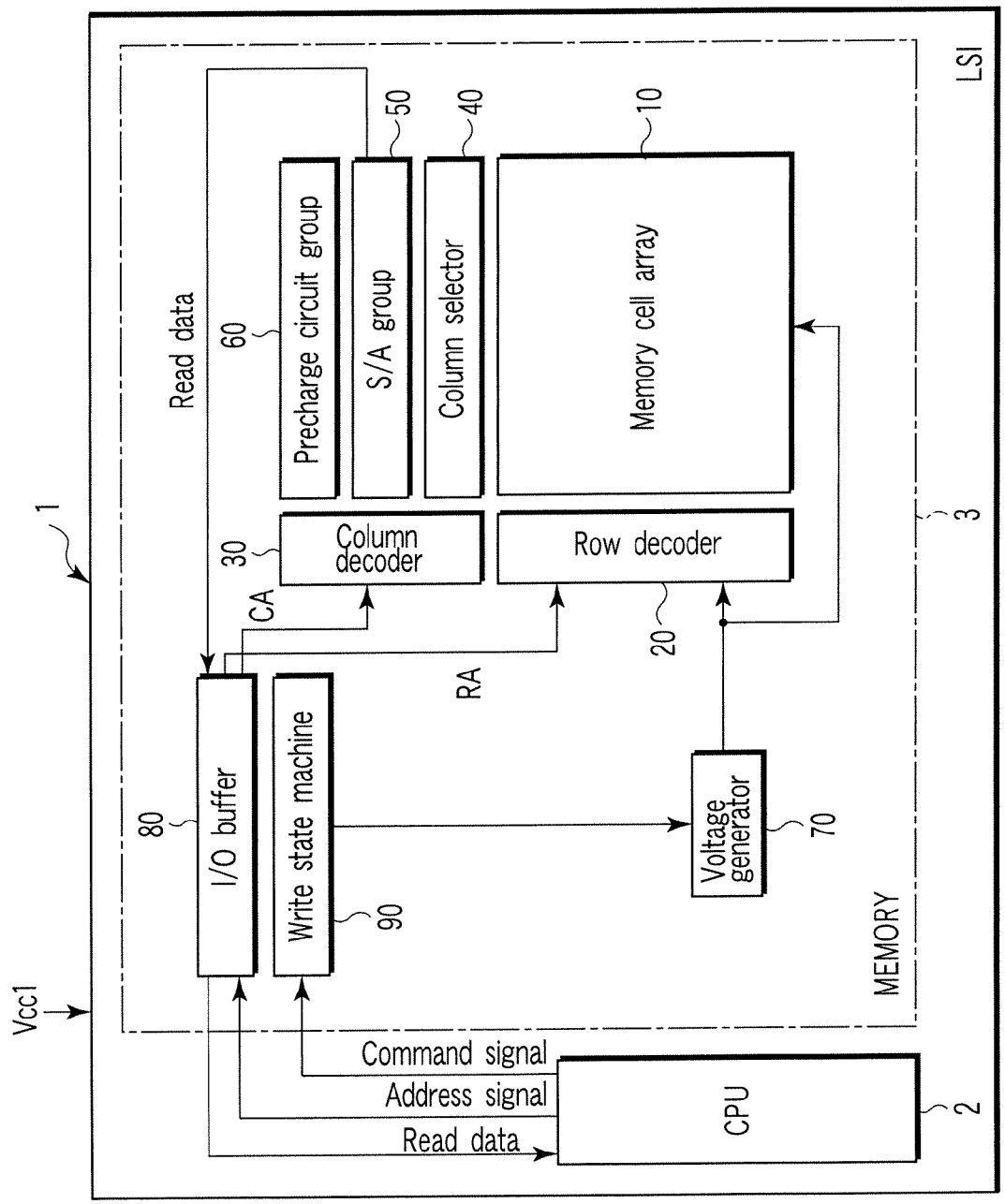
FIG. 1 is a block diagram of a system LSI according to a first embodiment of the present invention.

A semiconductor memory device according to a first embodiment of the present invention and a method of reading data in the semiconductor memory device will be explained using FIG. 1. FIG. 1 is a block diagram of a system LSI according to the first embodiment.

As shown in FIG. 1, a system LSI 1 includes a CPU 2 and a flash memory 3. The CPU 2 exchanges data with the flash memory 3. The flash memory 3, which is a 2Tr flash memory, includes a memory cell array 10, a row decoder 20, a column decoder 30, a column selector 40, a sense amplifier group 50, a precharge circuit group 60, a voltage generator circuit 70, an input/output buffer 80, and a write state machine 90. A voltage of Vcc1 (1.25 to 1.65 V) is externally supplied to the LSI 1.

Figure 2:
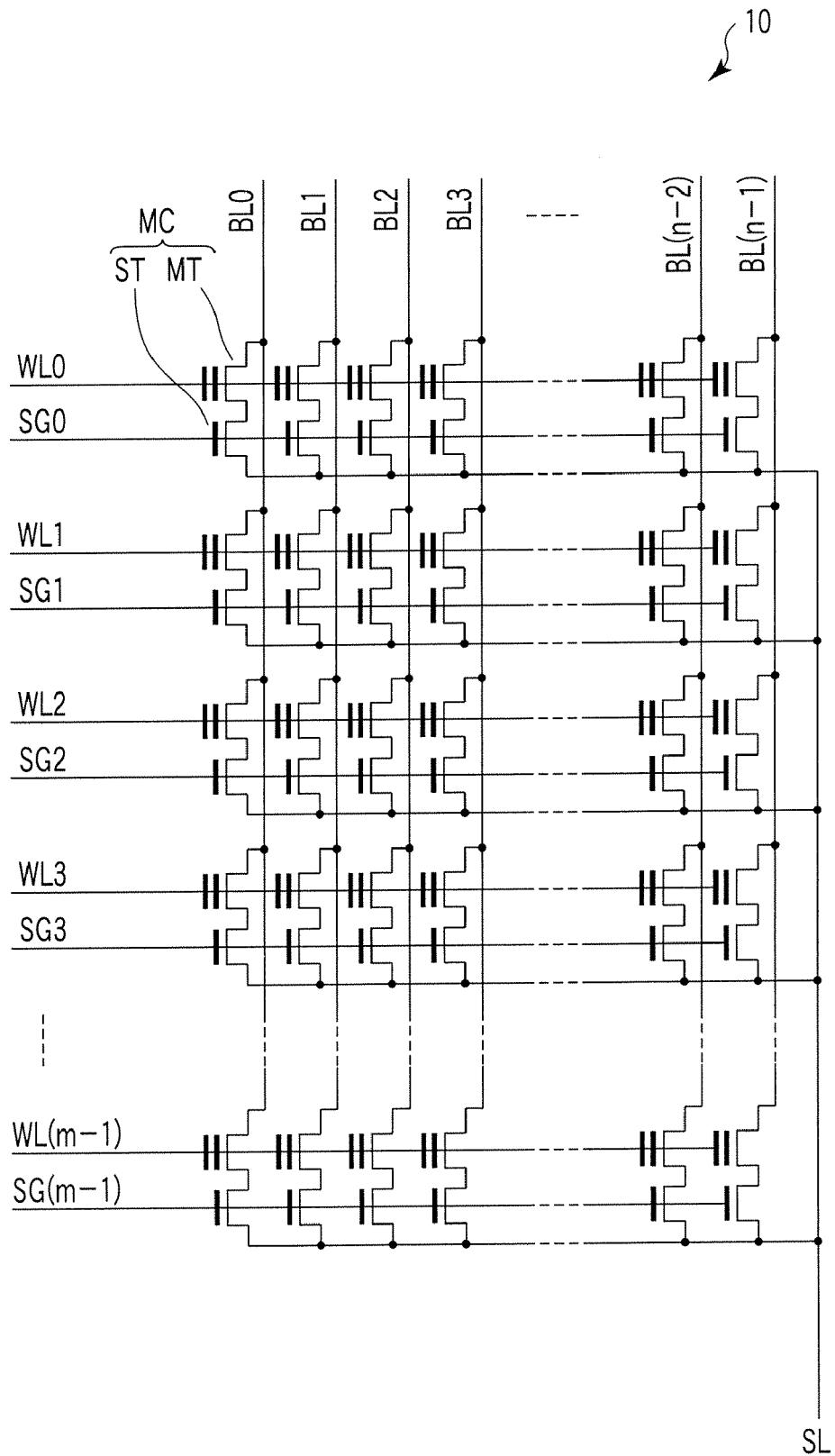
FIG. 2 is a circuit diagram of a memory cell array included in a 2Tr flash memory according to the first embodiment.

FIG. 2 is a circuit diagram of the memory cell array 10. As shown in FIG. 2, the memory cell array 10 includes a plurality of memory cells MC arranged in a matrix. The memory cells MCs are 2Tr flash memory cells. Each of the memory cells MC includes a memory cell transistor MT and a select transistor ST, which have their current paths connected in series with each other. The memory cell transistor MT has a stacked gate structure that includes a charge accumulation layer (or floating gate) formed on a semiconductor substrate with a gate insulating film interposed therebetween and a control gate formed on the floating gate with an inter-gate insulating film interposed therebetween. The floating gates are isolated in their respective memory cell transistors MT. The source region of the memory cell transistor MT is connected to the drain region of the select transistor ST.

The control gates of the memory cell transistors MT in a same row are connected commonly to any one of word lines WL0 to WL(m−1). The gates of the select transistors ST in a same row are connected commonly to any one of select gate lines SG0 to SG(m−1). The drains of the memory cell transistors MT in a same column are connected commonly to any one of bit lines LBL0 to LBL(n−1). The sources of all the select transistors ST are connected equally to a source line SL.

Figure 3:
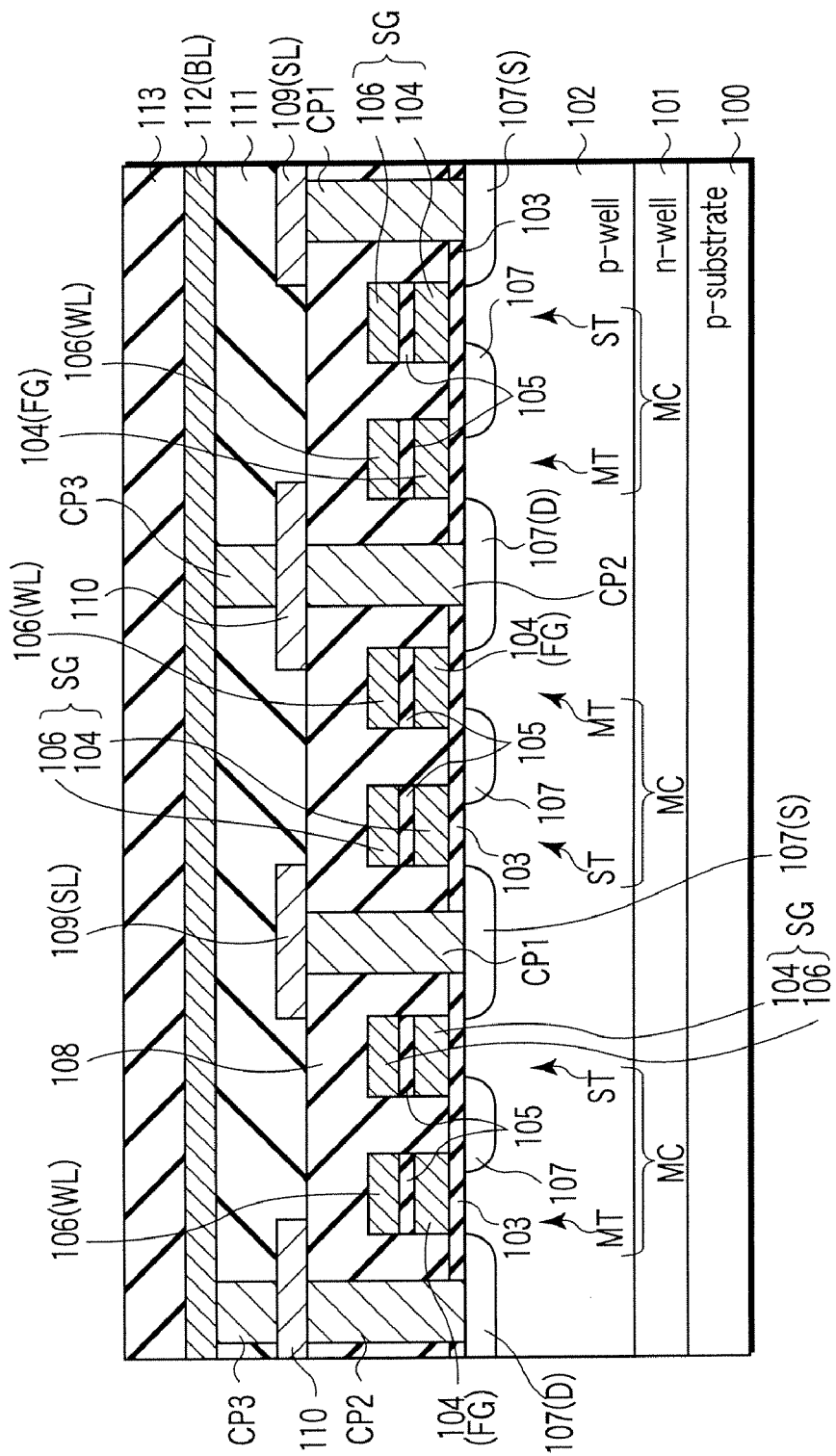
FIG. 3 is a sectional view of a memory cell array included in the 2Tr flash memory according to the first embodiment.

The sectional configuration of the memory cell array 10 will be explained using FIG. 3. FIG. 3 is a sectional view of the memory cell array 10 taken along a bit line. As shown in FIG. 3, an n-well region 101 is formed at the surface of a p-type semiconductor substrate 100. A p-well region 102 is formed at the surface of the n-well region 101. On the p-well region 102, a gate insulating film 103 is formed. On the gate insulating film 103, the gate electrodes of a memory cell transistor MT and a select transistor ST are formed. Each of the gate electrodes of the memory cell transistor MT and select transistor ST includes a polysilicon layer 104 formed on the gate insulating film 103, an inter-gate insulating film 105 formed on the polysilicon layer 104, and a polysilicon layer 106 formed on the inter-gate insulating film 105. The inter-gate insulating film 105 is made of, for example, a silicon oxide film, or an ON, NO, or ONO film having a stacked structure of a silicon oxide film and a silicon nitride film.

In a memory cell transistor MT, the polysilicon layers 104 function as floating gates (FG). The polysilicon layers 106, adjacent ones of which are connected to each other in a direction perpendicular to the bit line, function as control gates (word lines WL).

In a select transistor ST, adjacent ones of the polysilicon layers 104, 106 are connected to each other in the direction of word line. The polysilicon layers 104, 106 function as select gate lines SG. Only the polysilicon layers 104 may function as select gate lines. In this case, the potential of the polysilicon layer 106 of the select transistor ST is set to a constant potential or in the floating state.

At the surface of the p-well region 102 between gate electrodes, an $n^+$ impurity diffused layer 107 is formed. The impurity diffused layer 107, which is shared by adjacent transistors, functions as a source (S) or a drain (D).

On the p-well region 102, an interlayer insulating film 108 is formed so as to cover the memory cell transistor MT and select transistor ST. In the interlayer insulating film 108, a contact plug CP1 reaching the impurity diffused layer (or source) 107 shared by two select transistors ST, ST is formed. On the interlayer insulating film 108, a metal wiring layer 109 connected to the contact plug CP1 is formed. The metal wiring layer 109 functions as the source line SL. In the interlayer insulating film 108, a contact plug CP2 reaching the impurity diffused layer (or drain) 107 shared by two memory cell transistors MT, MT is formed. On the interlayer insulating film 108, a metal wiring layer 110 connected to the contact plug CP2 is formed.

On the interlayer insulating film 108, an interlayer insulating film 111 is formed so as to cover the metal wiring layers 99, 100. In the interlayer insulating film 111, a contact plug CP3 reaching the metal wiring layer 110 is formed. On the interlayer insulating film 111, a metal wiring layer 112 connected equally to a plurality of contact plugs CP3 is formed. The metal wiring layer 112 functions as a bit line BL. On the interlayer insulating film 111, an interlayer insulating film 113 is formed so as to cover the metal wiring layer 112.

Figure 4:
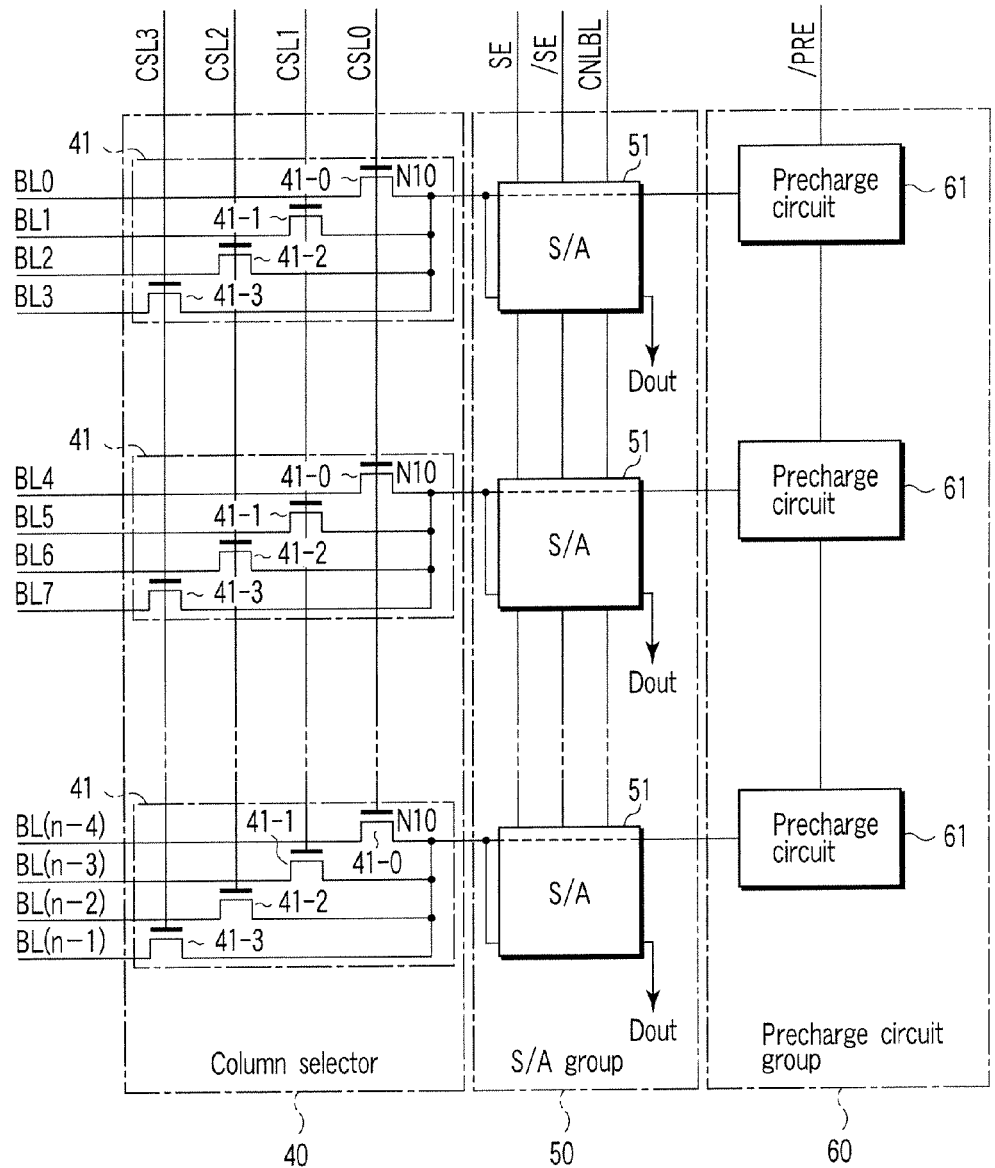
FIG. 4 is a circuit diagram of a sense amplifier group, a column selector, and a precharge circuit group included in the 2Tr flash memory according to the first embodiment.

Next, using FIG. 4, the configuration of the column selector 40, sense amplifier group 50, and precharge circuit group 60 will be explained. FIG. 4 is a circuit diagram of the column selector 40, sense amplifier group 50, and precharge circuit group 60. First, the column selector 40 will be explained.

As shown in FIG. 4, the column selector 40 includes read select circuits 41 provided for every 4 bit lines. While in the example of FIG. 4, the read select circuits 41 are provided for every 4 bit lines, they are not restricted to this. For instance, the read select circuits 41 may be provided for every 8 or 16 bit lines. Each of the read select circuits 41 has n-channel MOS transistors 41-0 to 41-3 provided for each of the bit lines BLi to BL(i+3) (where i=0, 4, 8, 12, . . .). One end of each of the MOS transistors 41-0 to 41-3 is connected to the corresponding bit lines BLi to BL(i+3). The other ends of the MOS transistors 41-0 to 41-3 are connected to one another at a common junction node. Hereinafter, the common junction node is referred to as node N10. The gates of the MOS transistors 41-0 to 41-3 are connected commonly to the column select lines CSL0 to CSL3, respectively. With the above configuration, each read select circuit 41 selects any one of bit lines BLi to BL(i+3).

Next, the sense amplifier group 50 will be explained. As shown in FIG. 4, the sense amplifier group 50 includes a plurality of sense amplifiers 51 provided for the read select circuits 41 in a one-to-one correspondence. Each sense amplifier 51 is connected to node N10 of the corresponding read select circuit 41. Moreover, the respective sense amplifiers 51 are connected commonly to sense amplifier activate signal lines SE, /SE and a connect signal line CNLBL. The sense amplifier 51 amplifies the data read from the memory cell MC to node N10.

Next, the precharge circuit group 60 will be explained. As shown in FIG. 4, the precharge circuit group 60 includes a plurality of precharge circuits 61 provided for the read select circuits 41 in a one-to-one correspondence. Each precharge circuit 61 is connected via the sense amplifier 51 to node N10 of the corresponding read select circuit 41 and to the same precharge signal line /PRE. The precharge circuit 61 precharges the bit line BL selected by the read select circuit 41.

Figure 5:
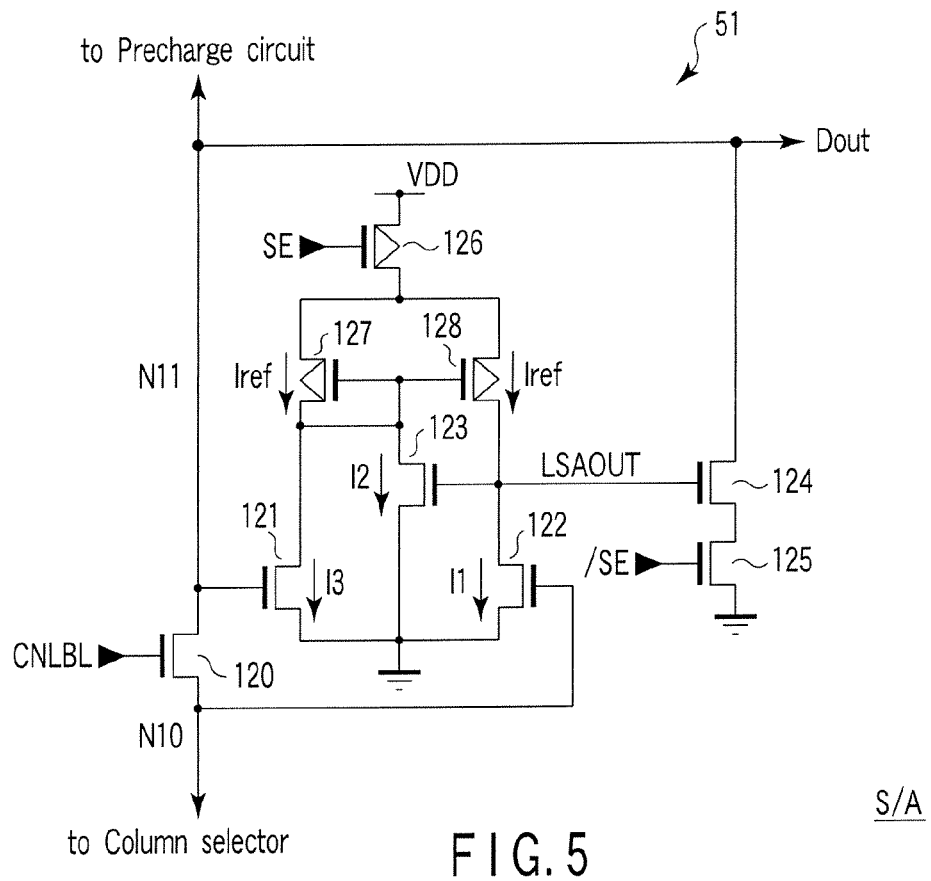
FIG. 5 is a circuit diagram of a sense amplifier included in the 2Tr flash memory according to the first embodiment.

FIG. 5 is a circuit diagram showing a configuration of the sense amplifier 51. As shown in FIG. 5, the sense amplifier 51 includes n-channel transistors 120 to 125 and p-channel MOS transistors 126 to 128. The MOS transistor 120 has its source connected to node N10, its drain connected to the precharge circuit 61, and its gate connected to a connect signal line CNLBL. Hereinafter, the junction node of the drain of the MOS transistor 120 and the precharge circuit 61 is referred to as node N11. The MOS transistor 121 has its gate connected to node N11, its source grounded, and its drain connected to the gates of the MOS transistors 127, 128 and to the drain of the MOS transistor 127. The MOS transistor 122 has its gate connected to node N10, its source grounded, and its drain connected to the drain of the MOS transistor 128. The MOS transistors 127, 128 have their gates connected to each other so as to form a current mirror circuit and their sources connected to each other. The MOS transistor 127 has its gate and drain connected to each other. The MOS transistor 126 has its gate connected to a sense amplifier activate signal line SE, its source connected to a power supply potential VDD, and its drain connected to the sources of the MOS transistors 127, 128. The MOS transistor 123 has its source grounded, its drain connected to the gate and drain of the MOS transistor 127 and to the gate of the MOS transistor 128, and its gate connected to a junction node of the drain of the MOS transistor 128 and the drain of the MOS transistor 122. The MOS transistor 124 has its gate connected to a junction node of the MOS transistors 128, 122, 123, its drain connected to node N11, and its source connected to the drain of the MOS transistor 125. The MOS transistor 125 has its source grounded and its gate connected to an inverted sense amplifier activate signal line /SE.

Figure 6:
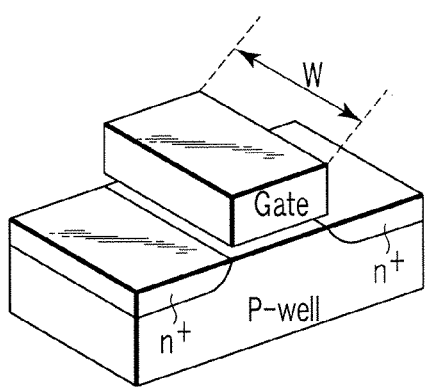
FIG. 6 is a perspective view of a MOS transistor.

With the above configuration, the sense amplifier 51 determines whether the potential applied to the gate of the MOS transistor 122 is "0" data or "1" data using the potential input to the gate of the MOS transistor 121 as a reference. The MOS transistor 122 outperforms the MOS transistor 121 in current supplying capability. For example, as shown in FIG. 6, the MOS transistors 121, 122 are so formed that the gate width W of the MOS transistor 122 is greater than that of the MOS transistor 121. On the other hand, the MOS transistors 127, 128 have, for example, the same current supplying capability. That is, the MOS transistors 127, 128 have the same gate width W. Hereinafter, the junction node of the gates of the MOS transistors 124, 123 and the drains of the MOS transistors 122, 128 is referred to as node LSAOUT.

Getting back to FIG. 1, the explanation will be continued. In a write operation, the row decoder 20 selects any one of the word lines WL0 to WL(m−1) on the basis of a row address signal RA and supplies a voltage to the selected word line. Moreover, in a read operation, the row decoder 20 selects any one of the select gate lines SG0 to SG(m−1) on the basis of a row address signal RA and supplies a voltage to the selected select gate line. Furthermore, the row decoder 20 supplies a voltage to a semiconductor substrate (p-well region 102) in which memory cells have been formed.

The column decoder 30, in a read operation, selects any one of the column select lines CSL0 to CSL3 on the basis of a column address signal CA and supplies a voltage to the selected read column select line. In addition, the column decoder 30 selects the signal lines SE, /SE, CNLBL connected to the sense amplifier 51 and supplies a voltage to these selected lines.

The voltage generator circuit 70 has a positive charge pump circuit and a negative charge pump circuit. On the basis of an externally applied voltage Vcc1, the voltage generator circuit 70 generates a positive voltage VPP (e.g., 12 V) and a negative voltage VBB (e.g., −7 V). The positive voltage VPP and negative voltage VBB are supplied to the row decoder 20, memory cell array 10, and others.

The input/output buffer 80 holds the read data amplified at the sense amplifier group 50 and outputs the data to the CPU 2. The input/output buffer 80 further holds the write data and address signal received from the CPU 2. Then, the input/output buffer 80 supplies a column address signal CA to the column decoder 30 and a row address signal RA to the row decoder 20.

On the basis of an instruction signal given by the CPU 2, the write state machine 90 controls the operation of each circuit included in the flash memory 3, controls timing of data writing, erasing, and reading, and executes a specific algorithm determined for each operation.

Next, the 2Tr flash memory configured as described above will be explained. A state where electrons are injected into the floating gate of a memory cell MC and the threshold voltage of the memory cell MC is positive is defined as "0" data, whereas a state where no electrons are injected into the floating gate and the threshold voltage of the memory cell MC is negative is defined as "1" data.

Write Operation

Figure 7:
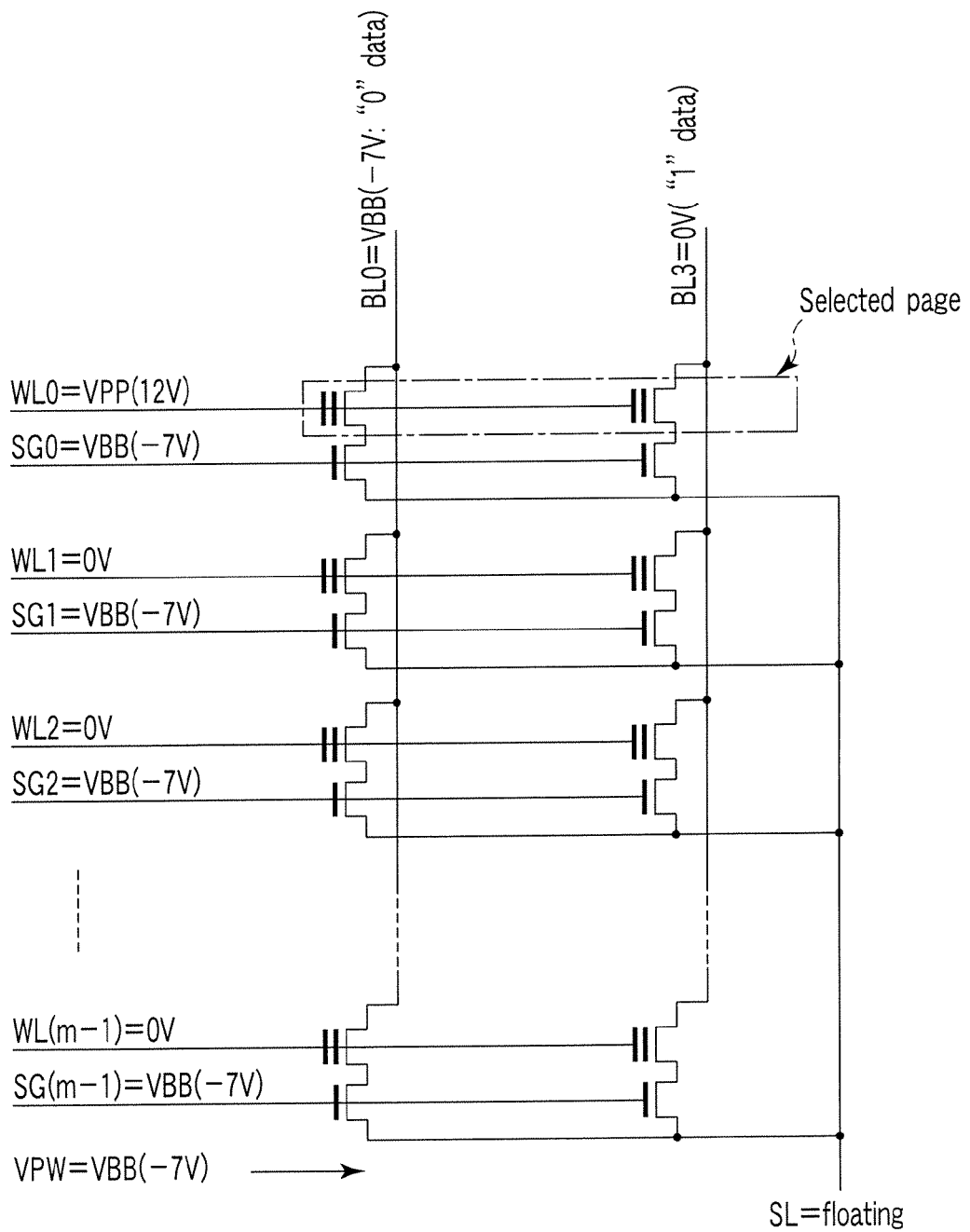
FIG. 7 is a circuit diagram of the memory cell array included in the 2Tr flash memory according to the first embodiment, showing a write operation.

First, the operation of writing data will be explained using FIG. 7. FIG. 7 is a circuit diagram of the memory cell array 10 in a write operation. To simplify the explanation, only two bit lines BL0, BL3 are shown. Memory cell data is written simultaneously into a plurality of memory cells (which are referred to as one page) connected commonly to any one of the word lines. FIG. 7 shows a case where "0" data is written into the memory cell MC connected to word line WL0 and bit line BL0 and is written into the memory cell MC connected to word line WL0 and bit line BL3.

To write data, the voltage generator circuit 70 generates the positive voltage VPP and negative voltage VBB according to an instruction given by the write state machine 90.

Moreover, the write data given by the CPU 2 is supplied to the bit lines BL0, BL3. The negative voltage VBB is applied to the bit line BL0 connected to the memory cell MC into which "0" data is to be written, whereas 0 V is applied to the bit line BL3 connected to the memory cell MC into which "1" data is to be written.

Then, the row decoder 20 selects word line WL0 and applies the positive voltage VPP to word line WL0. To the unselected word lines WL1 to WL(m−1), 0 V is applied. Furthermore, the row decoder 20 not only applies the negative voltage VBB to all of the select gate lines SG0 to SG(m−1) but also sets at VBB the potential VPW of the p-well region 102 in which the memory cells have been formed. The potential of the source line SL is brought into the floating state.

As a result, in the memory cell transistor MT connected to bit line BL0 and word line WL0, since the potential difference between the gate and channel is sufficient (VPP−VBB=19V), electrons are injected into the floating gate by FN tunneling, with the result that the threshold value of the memory cell MC changes from negative to positive. That is, "0" data is written. On the other hand, in the memory cell transistor MT connected to bit line BL3 and word line WL0, since the potential difference between the gate and channel is insufficient (VPP=12 V), no electrons are injected into the floating gate, with the result that the memory cell MC keeps the negative threshold value. That is, "1" data is written.

As described above, data is written simultaneously into one page of memory cell transistors.

Erase Operation

Figure 8:
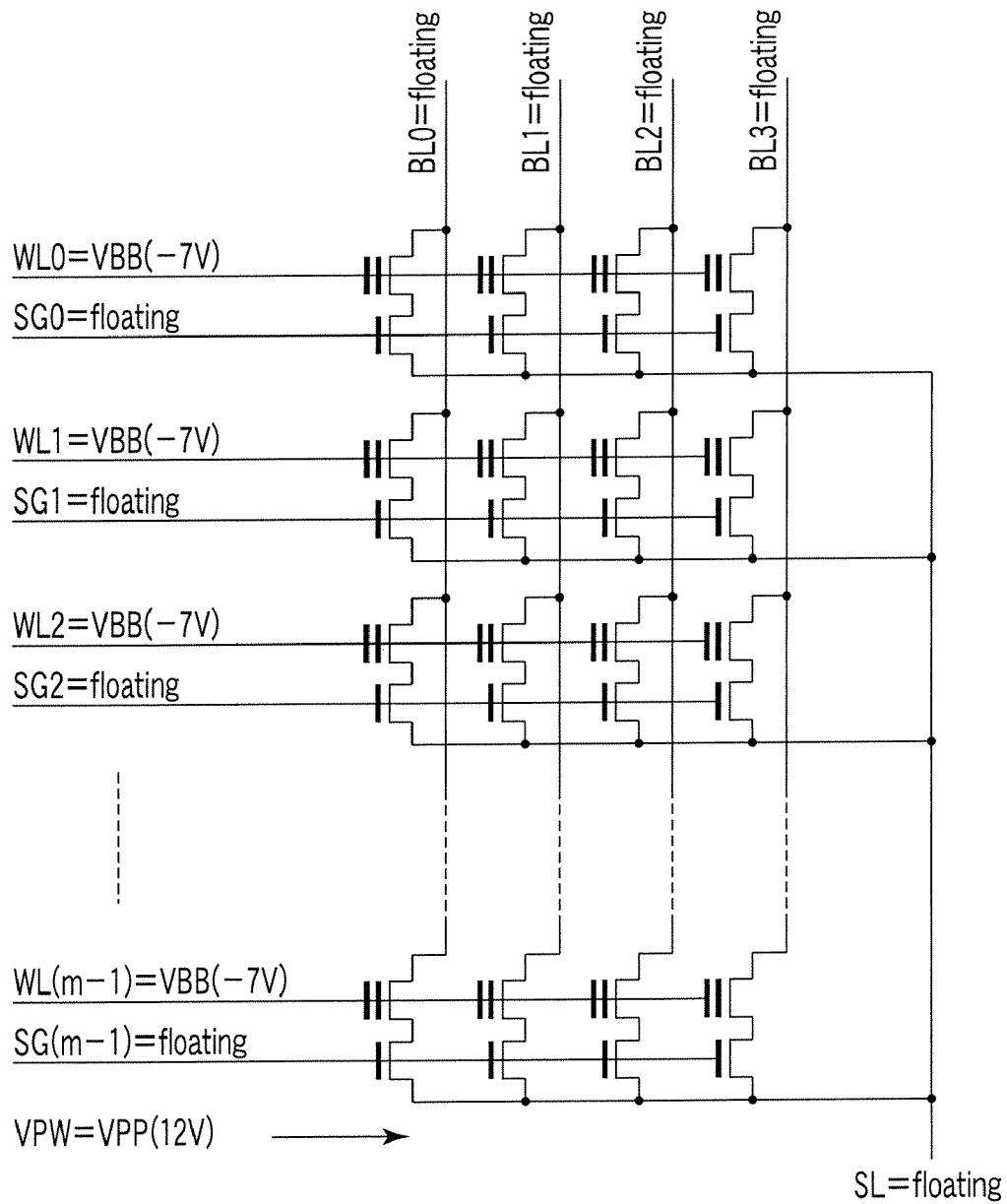
FIG. 8 is a circuit diagram of the memory cell array included in the 2Tr flash memory according to the first embodiment, showing an erase operation.

Next, the operation of erasing data will be explained using FIG. 8. FIG. 8 is a circuit diagram of the memory cell array 11 in an erase operation. To simplify the explanation, only four bit lines BL0 to BL3 are shown in FIG. 8. The data is erased simultaneously from all of the memory cells which share the p-well region 102. An erase operation is carried out by drawing electrons out of the floating gate by FN tunneling.

To erase, the voltage generator circuit 70 generates the positive voltage VPP and negative voltage VBB. Then, the row decoder 20 applies VBB to all the word lines WL0 to WL(m−1), brings all the select gate lines SG0 to SG(m−1) into the electrically floating state, and further supplies the positive voltage VPP as VPW. The source line and all the bit lines LBL0 to LBL3 are also brought into the electrically floating state.

As a result, the electrons are drawn out of the floating gates of the memory cell transistors MT into the well region 102 by FN tunneling. This erases the data in all of the memory cells MC connected to the word lines WL0 to WL(m−1), with the result that the threshold voltage becomes negative. In this way, the data is erased simultaneously. The positive voltage VPP may be applied to the select gate lines SG0 to SG(m−1). In this case, the voltage stress applied to the gate insulating film 103 of the select transistor can be suppressed.

Read Operation

Figure 9:
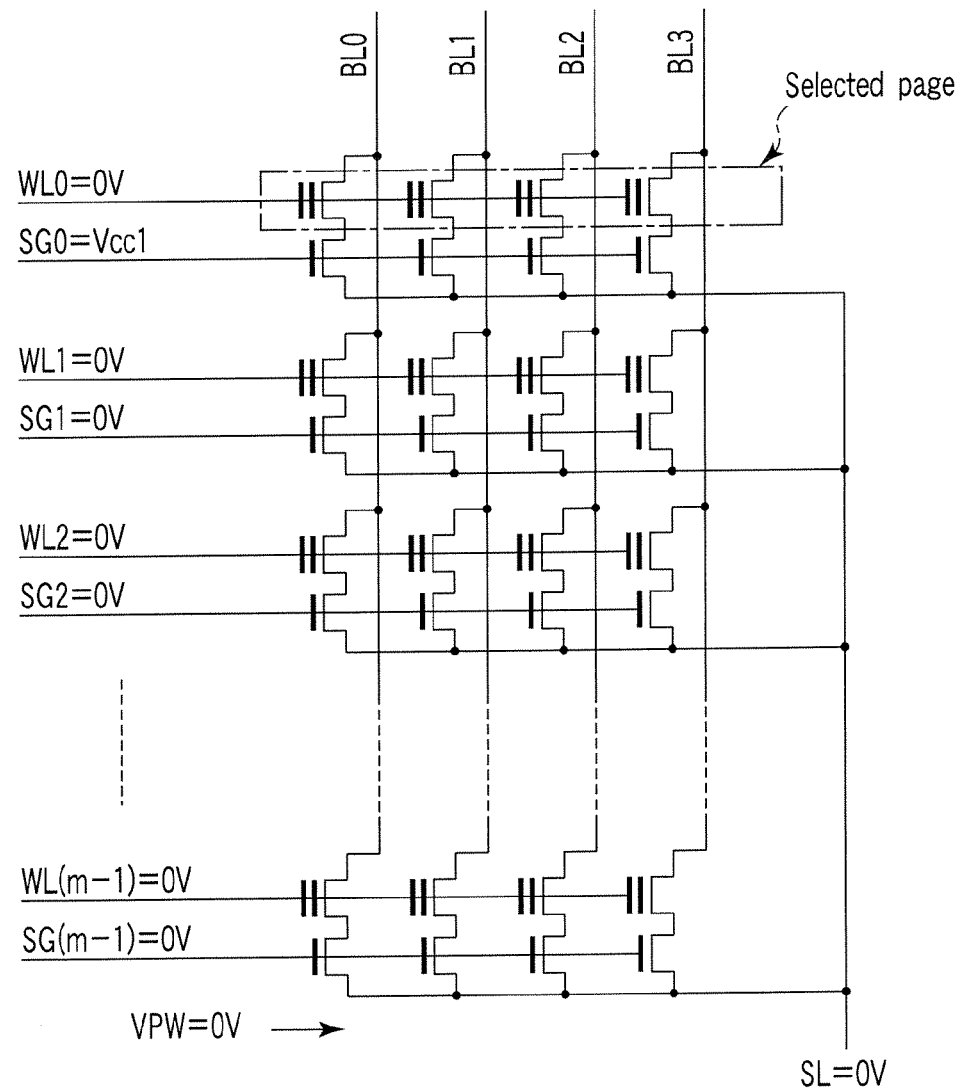
FIG. 9 is a circuit diagram of the memory cell array included in the 2Tr flash memory according to the first embodiment, showing a read operation.

Next, a read operation will be explained using FIG. 9. FIG. 9 is a circuit diagram of the memory cell array 10 in a read operation. To simplify the explanation, only four bit lines BL0 to BL3 are shown in FIG. 9. FIG. 9 shows a case where the data is read from the memory cells connected to word line WL0.

First, any one of the bit lines BL0 to BL3 connected to the memory cell MC from which the data is to be read is selected by the column selector 40. The selected bit line is precharged by the precharge circuit 61 until a specific precharge potential has been reached. Then, the row decoder 20 selects select gate line SG0 and applies a positive voltage Vcc 1 to select gate line SG0. All of the word lines WL0 to WL(m−1), the source line SL, and the well potential VPW are set to 0 V.

Then, the select transistor ST connected to select gate line SG0 turns on. Accordingly, if the data written in the memory cell transistor MT connected to selected word line WL0 in the memory cells connected to the precharged bit line is "1," current will flow from the bit line to the source line. On the other hand, if the written data is "0" no current will flow. Then, a change in the potential of the bit line caused by the flowing of current in the memory cell MC is amplified by the sense amplifier 51.

As described above, the operation of reading the data is carried out.

Details of Read Operation

Figure 10:
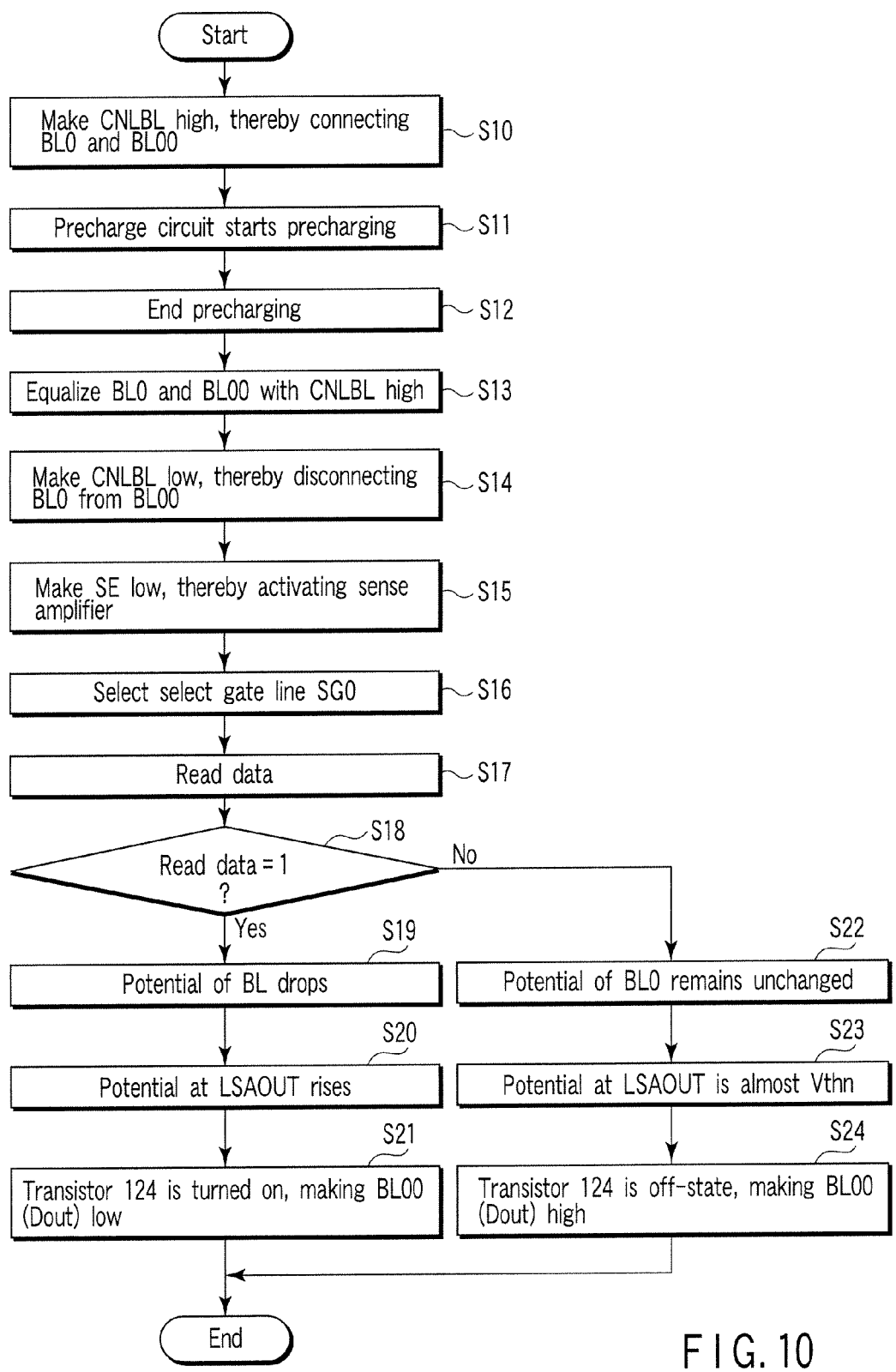
FIG. 10 is a flowchart to help explain a read operation in the 2Tr flash memory according to the first embodiment.
Figure 11:
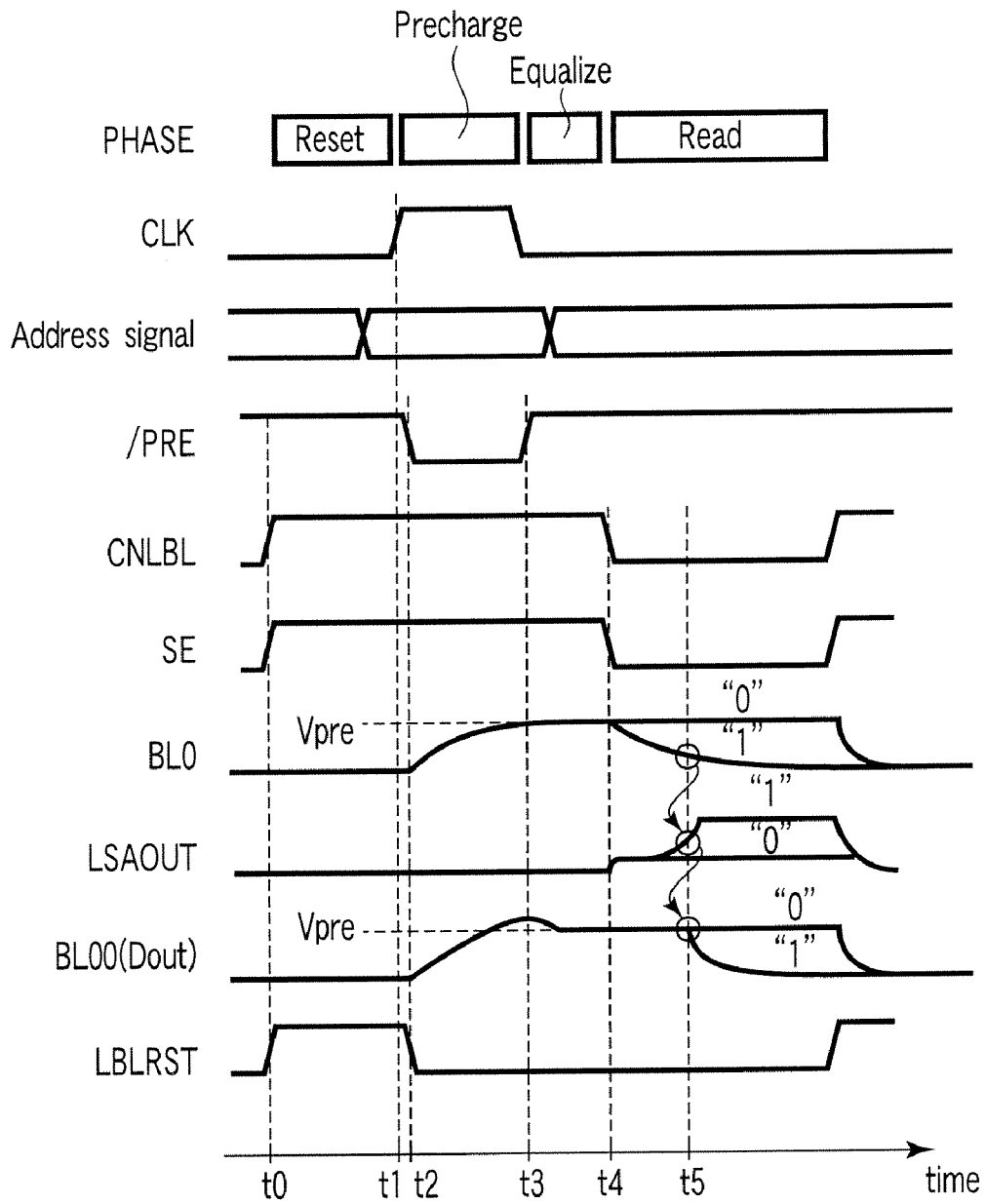
FIG. 11 is a timing chart for various signals in a read operation in the 2Tr flash memory according to the first embodiment.

Next, using FIGS. 4 and 5 and FIGS. 9 to 11, a read operation will be explained in detail. FIG. 10 is a flowchart to help explain a read operation. FIG. 11 is a timing chart for various signals in a read operation.

Hereinafter, a case where the data is read from the memory cell MC connected to word line WL0 and select gate line SG0 will be explained as an example. A memory cell from which the data is to be read is referred to as a selected memory cell. The bit line to which the selected memory cell is connected is referred to as the selected bit line. Only the selected bit line BL0 will be explained. Node N11 corresponding to the selected bit line BL0 is referred to as bit line BL00.

First, the column decoder 30 resets the bit lines BL (time t0 in FIG. 11). Specifically, the column decoder 30 makes a reset signal LBLRST high ("H") level, turning on the MOS transistors (reset transistors) (not shown) connected to the bit lines BL0 to BL(n−1), which grounds the bit lines. As a result, the potentials of the bit lines BL0 to BL(n−1) are reset to 0 V. Further at this time, the input/output buffer 80 supplies a column address signal CA and a row address signal RA to the column decoder 30 and row decoder 20.

Furthermore, the column decoder 30 makes column select line CSLC high ("H") level and column select lines CSL1 to CSL3 low ("L") level. As a result, in the column selector 40, the MOS transistor 41-0 turns on and the MOS transistors 41-1 to 41-3 turn off. Consequently, the selected bit line BL0 is connected to the sense amplifier 51. Moreover, the column decoder 30 makes a connect signal line CNLBL high ("H") level. This turns on the MOS transistor 120 in the sense amplifier 51. As a result, the selected bit line BL0 is connected via bit line BL00 to the precharge circuit 61 (step S10, time t0). The reset transistor may be provided for each node N10. In this case, only the bit line BL0 selected by the column selector 40 is reset.

Next, the precharge circuit 61 starts to precharge bit lines BL0, BL00 (step S11). Specifically, in response to the clock signal CLK supplied by the clock generator circuit included in the 2Tr flash memory 3 or by the CPU2 (time t1), a precharge signal /PRE is set at low ("L") level (time t2). The precharge signal /PRE is a signal asserted (or set at the low level) in a precharge operation. This causes the precharge circuit 61 to precharge bit lines BL0, BL00. At this time, since the MOS transistors 41-1 to 41-3 are kept in the off state, the unselected bit lines are not precharged. Of course, during precharging, the reset signal LBLRST is kept in the low ("L") level.

After the selected bit line BL0 and bit line BL00 have reached a precharge potential Vpre, the precharge signal /PRE is negated (or set at the high ("H") level) in response to the clock signal CLK, terminating the precharging (step S12, time t3). After the precharging is terminated, the potential of the selected bit line BL0 and that of BL00 are equalized during a specific interval between time t3 and time t4 (step S13). As a result, the potential of the selected bit line BL0 and that of BL00 become equal at a certain precharge potential Vpre. The reason why equalization is necessary is that, since bit line BL00 is closer to the precharge circuit 61 than bit line BL0, the potential of bit line BL00 is higher than that of bit line BL0 during a precharging operation. When the selected bit line BL0 and bit line BL00 have reached the precharge potential Vpre, this turns on the MOS transistors 121, 122 of the sense amplifier 51.

Next, the connect signal line CNLBL is made low ("L") level (step S14, time t4). This separates the selected bit line BL0 electrically from bit line BL00. Moreover, the column decoder 30 asserts the sense amplifier activate signal line SE (or sets the signal line SE at the low ("L") level) (step S15, time t4). As a result, the MOS transistors 125, 126 of the sense amplifier 51 turn on, thereby activating the sense amplifier 51.

Then, on the basis of the row address signal RA, the row decoder 20 selects select gate line SG0 (step S16). Specifically, the voltage Vcc1 is applied to select gate line SG0. 0 V is applied to word line WL0. Select gate line SG0 may be selected before, for example, time t1. As a result, the reading of data from the memory cell MC is started (step S17). Since the MOS transistor 120 is in the off state during the time when the data is being read from the memory cell MC, the potential of bit line BL00 is in the floating state at the precharge potential Vpre.

When the data read onto the selected bit line BL0 is "1" data (step S18), the memory cell MC discharges the selected bit line BL0, with the result that the potential of the selected bit line BL0 drops from the precharge potential Vpre (step S19, time t4). As a result, the MOS transistor 122 gradually turns off. Accordingly, the potential at node LSAOUT of the sense amplifier 51 rises gradually from 0 V (step S20) and eventually reaches the power supply potential VDD of the sense amplifier 51. When the potential at node LSAOUT has risen and reached the threshold value of the MOS transistor 124, the MOS transistor 124 turns on (step S21, time t5). As a result, the bit line BL00 is discharged via the current path of the MOS transistors 124, 125, with the result that the potential of bit line BL00 becomes almost 0 V. Then, the potential of bit line BL00 discharged to almost 0 V is output as the read data Dout from the sense amplifier 51.

Conversely, when the data read from the selected bit line BL0 is "0" data (step S18), the potential of the selected bit line BL0 remains at the precharge potential (step S22). Here, in FIG. 5, suppose the currents supplied by the MOS transistors 127, 178 are Iref and the currents supplied by the MOS transistors 122, 123 are I1 and I2, respectively. Then, even if the gate potentials of the MOS transistors 121, 122 are equal, the potential at node LSAOUT is higher than 0 V and lower than the threshold voltage Vthn of an n-channel MOS transistor (step S23). The reason is that, since the gate width W of the MOS transistor 122 is greater than that of the MOS transistor 121, the expression Iref<I1 holds. Accordingly, the MOS transistor 124 turns off, with the result that the potential of bit line BL00 remains at the precharge potential Vpre (step S24). Then, the potential of bit line BL00 remaining at the precharge potential is output as read data Dout from the sense amplifier 51.

As described above, the flash memory according to the first embodiment produces the effects described in the following items (1) to (3).

(1) It is possible to read data at high speed, while suppressing an increase in the area of the flash memory.

In the flash memory according to the embodiment, the precharge potential of the bit line is used as the reference potential of the sense amplifier 51. Therefore, a circuit for generating the reference potential is not needed.

In a conventional sense amplifier which compares the reference potential with the bit line voltage in reading data, it is necessary to provide a reference current Iref2 based on the reference potential for each sense amplifier or cause a current mirror to supply a reference current to each sense amplifier. Consequently, the area of a circuit for generating the reference potential (or a reference potential generator circuit) becomes very large. Moreover, a configuration where a reference memory cell having the same configuration as that of a memory cell is used as a reference potential generator circuit is also known. In this case, however, it is necessary to control the threshold value or the gate voltage value of the reference memory cell in such a manner that current Icell flowing in the memory cell in a read operation and current Iref2 flowing in the reference memory cell almost satisfy the equation Iref2=Icell/2. In this case, too, it is necessary to provide the reference memory cell for each sense amplifier or cause a current mirror to supply the current in one reference memory to each sense amplifier. This contributes to an increase in the area of the semiconductor memory. In addition, the current adjustment of the reference memory cell leads to an increase in the test time. Moreover, when a plurality of sense amplifiers share the reference memory cell and use current mirror circuits to supply Iref2 to the individual sense amplifiers, characteristic variations between the current mirror circuits also contribute to the destabilization of the operation.

In the present embodiment, however, since the precharge potential itself is used as the reference potential, it is possible to suppress an increase in the area and solve all the problems encountered in the conventional equivalent. Moreover, since the sense amplifier uses the precharge potential of the bit line connected to the sense amplifier as a reference potential, even if the precharge potential varies between bit lines, this exerts no adverse effect on the operation. That is, since a current can be sensed in a closed system of a sense amplifier and a bit line connected to the sense amplifier, it is possible to realize a sense amplifier highly immune to characteristic variations between sense amplifiers or variations in the precharge potential.

Furthermore, with the sense amplifier according to the embodiment, the precharge potential as high as the MOS transistors 121, 122 can cause current to flow is enough. That is, if the threshold voltage of the MOS transistors 121, 122 is Vthn, the expression Vpre>Vthn has only to hold. In the case of a conventional sense amplifier using an inverter, if the power supply voltage of the inverter is VDD, the precharge potential is about VDD/2. Usually, the expression Vthn<VDD/2 holds. That is, since the embodiment can suppress the precharge potential to a low level, the precharge time can be shortened. As a result, a high-speed read operation is possible.

(2) High-speed reading is possible (part 1)

Figure 12:
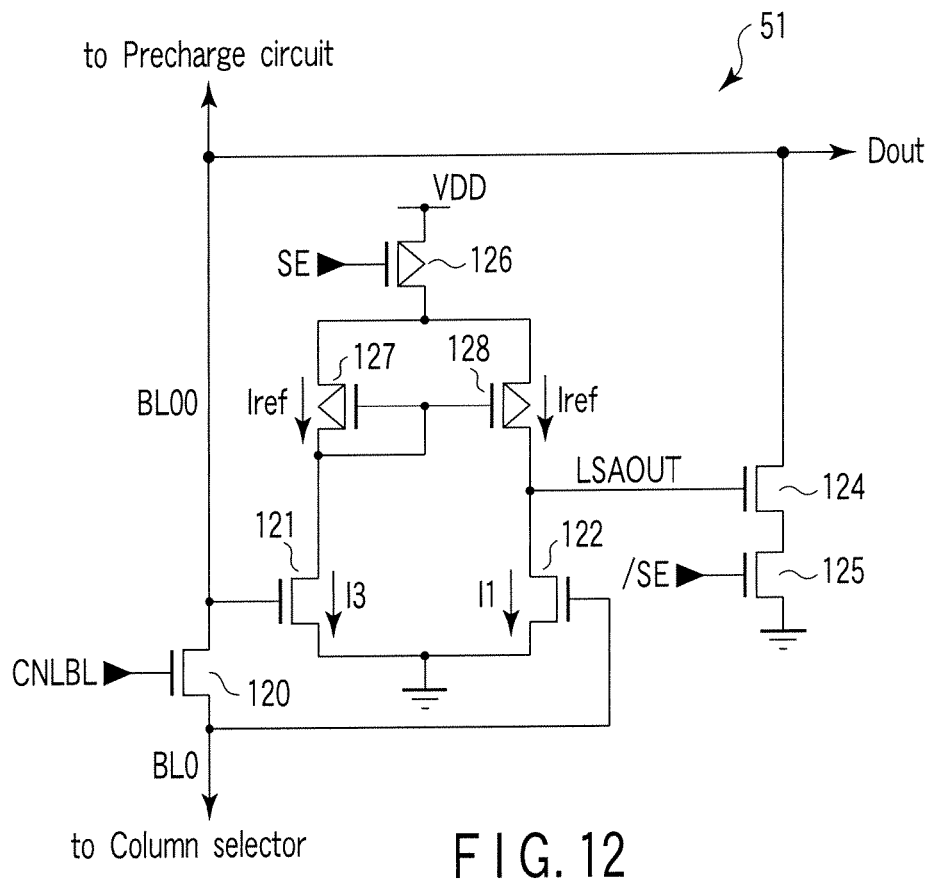
FIG. 12 is a circuit diagram of the sense amplifier, showing a precharge operation.
Figure 13:
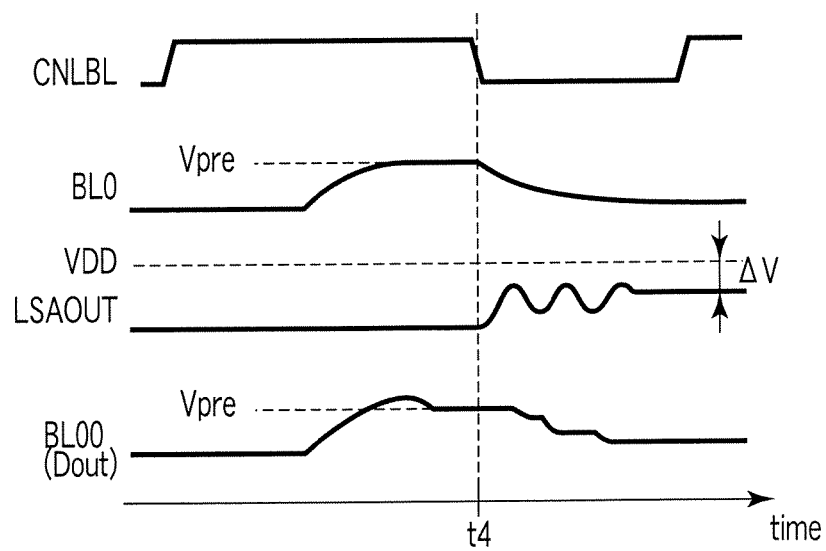
FIG. 13 is a timing chart for various signals in a read operation.

The sense amplifier according to the embodiment includes the MOS transistor 123. Therefore, when "1" data is read, the MOS transistor 123 causes current to flow, which enables "1" data to be sensed. This will be explained in detail in comparison with the sense amplifier 51 shown in FIG. 12. FIG. 12 is what is obtained by removing the MOS transistor 123 from the sense amplifier 51 of FIG. 5. FIG. 13 is a timing chart for various signals in a read operation when the sense amplifier 51 is used.

With the configuration of FIG. 12, suppose "1" data is read onto bit line BL0 and the potential of the bit line BL0 drops. Then, since the gate potential of the MOS transistor 122 drops, current I1 flowing in the MOS transistor 122 decreases, resulting in Iref>I1. Then, the potential at node LSAOUT rises gradually. When the potential has reached the threshold voltage Vthn of the MOS transistor 124, bit line BL00 (or node Dout) is discharged by the MOS transistors 124, 125. At this time, the current flowing through the MOS transistors 124, 125 is sufficiently larger than the cell current Icell. Accordingly, the potential of bit line BL00 drops more sharply than that of bit line BL0. A drop in the potential of bit line BL00 causes the gate potential of the MOS transistor 121 to drop. Then, the MOS transistor 121 begins turning off, causing current I3 supplied by the MOS transistor 121 to decrease. That is, since I3=Iref, Iref decreases. Then, when the expression Iref<I1 is satisfied, the potential at node LSAOUT drops below Vthn (low ("L") level). At this time, the potential of bit line BL0 is almost equal to that of BL00.

Furthermore, when the discharging of the memory cell results in a decrease in the potential of bit line BL0, the same thing as described above is repeated. Therefore, as shown in the timing chart of FIG. 13, the potential at node LSAOUT approaches a certain intermediate potential, while fluctuating. Then, when the potential of bit line BL00 has dropped to about Vthn, this prevents current I3 from flowing, giving Iref≈0, with the result that the sense amplifier 51 stops the operation.

With the above configuration, since the potential at node LSAOUT stays at an intermediate level between 0 V and VDD, the sense circuit is very unstable. Furthermore, the potential at node LSAOUT changes, while fluctuating, even if the data can be sensed, the data read time becomes very long.

In contrast, with the sense amplifier according to the embodiment, the MOS transistor 123 is provided as shown in FIG. 5. "1" data is read onto bit line BL0, causing the potential of bit line BL0 to drop and the potential at node LSAOUT to become equal to or higher than Vthn, which causes bit line BL00 to be discharged. At this point in time, since the sense amplifier 51 has determined that the data is "1" data, node LSAOUT has only to be made high ("H") level to discharge bit line BL00 completely. With the configuration of the embodiment, the MOS transistor 123 is provided which has its source grounded, its gate connected to node LSAOUT, and its drain connected to the drain of the MOS transistor 127. Therefore, when the potential at node LSAOUT becomes equal to or higher than Vthn, the MOS transistor 123 turns on, with the result that current I2 starts to flow. From this point on, too, the potential of bit line BL00 continues dropping, which prevents current I3 from flowing. However, current I2 continues flowing and therefore Iref also continues flowing. Consequently, as shown in FIG. 11, the potential at node LSAOUT reaches the high ("H") level rapidly without oscillating as shown in FIG. 13. Accordingly, the read speed can be improved. Moreover, since the potential at node LSAOUT has reached almost VDD, a very stable sensing operation can be performed.

Since the MOS transistor 123 has only to help current Iref to flow to finally determine data, the size of the transistor may be smaller than that of the other transistors in the sense amplifier 51.

(3) Accurate reading is possible

The sense amplifier 51 according to the embodiment is so configured that the current supplying capability of the MOS transistor 122 to which read data is input is superior to that of the MOS transistor 121 to which the reference potential is applied. More specifically, the gate width W of the MOS transistor 122 is made greater than that of the MOS transistor 121. Therefore, particularly when "0" data is read, accurate reading is possible. This will be explained in detail below.

When "0" data has been read onto bit line BL0, since bit line BL0 is not discharged, the potential at node LSAOUT has to be made low ("L") level. However, when the current supplying capability of the MOS transistor 121 and that of the MOS transistor 122 are the same, the potential of bit line BL0 is equal to that of bit line BL00. Accordingly, the gate potentials of the MOS transistors 127, 128 and the potential at node LSAOUT are intermediate potentials between 0 V and VDD. Then, when the intermediate levels are equal to or higher than Vthn, the MOS transistor 124 turns on, causing bit line BL00 to be discharged. As a result, "0" data read onto bit line BL0 might be determined to be "1" data by mistake.

In this respect, with the embodiment, the current supplying capability of the MOS transistor 122 is superior to that of the MOS transistor 121. Accordingly, even if the potential of bit line BL0 is equal to that on bit line BL00, the expression Iref<I1 holds. As a result, when "C" data has been read onto bit line BL0, the potential at node LSAOUT is 0 V or higher and lower than Vthn, turning off the MOS transistor 124. Consequently, erroneous reading can be prevented.

Furthermore, making the gate width W of the MOS transistor 122 greater than that of the MOS transistor 121 produces the effect described below. In a differential amplifier circuit used in a conventional sense amplifier, care should be taken to prevent characteristic variations from occurring in a differential pair of transistors (corresponding to the MOS transistors 121, 122 in the embodiment). The reason is that a differential amplifier discriminates a very small potential difference. For this reason, transistors whose gate length and gate width are relatively large are used as a differential pair of transistors so that an offset may not occur between the differential pair of transistors due to the threshold difference ΔVth or the gate length difference ΔL.

With the configuration of the embodiment, however, the gate width W of the MOS transistor 122 is made greater than that of the MOS transistor 121. Accordingly, the difference in gate width W between the MOS transistors 122, 121 is set to such a value as overcomes characteristic variations (e.g., twice the variation), which makes it unnecessary to take into account the offset of the MOS transistors 121, 122. As a result, the operation margin of the sense amplifier 51 can be made larger. In addition, there is no need to use transistors whose gate length is large as the MOS transistors 121, 122.

Figure 14:
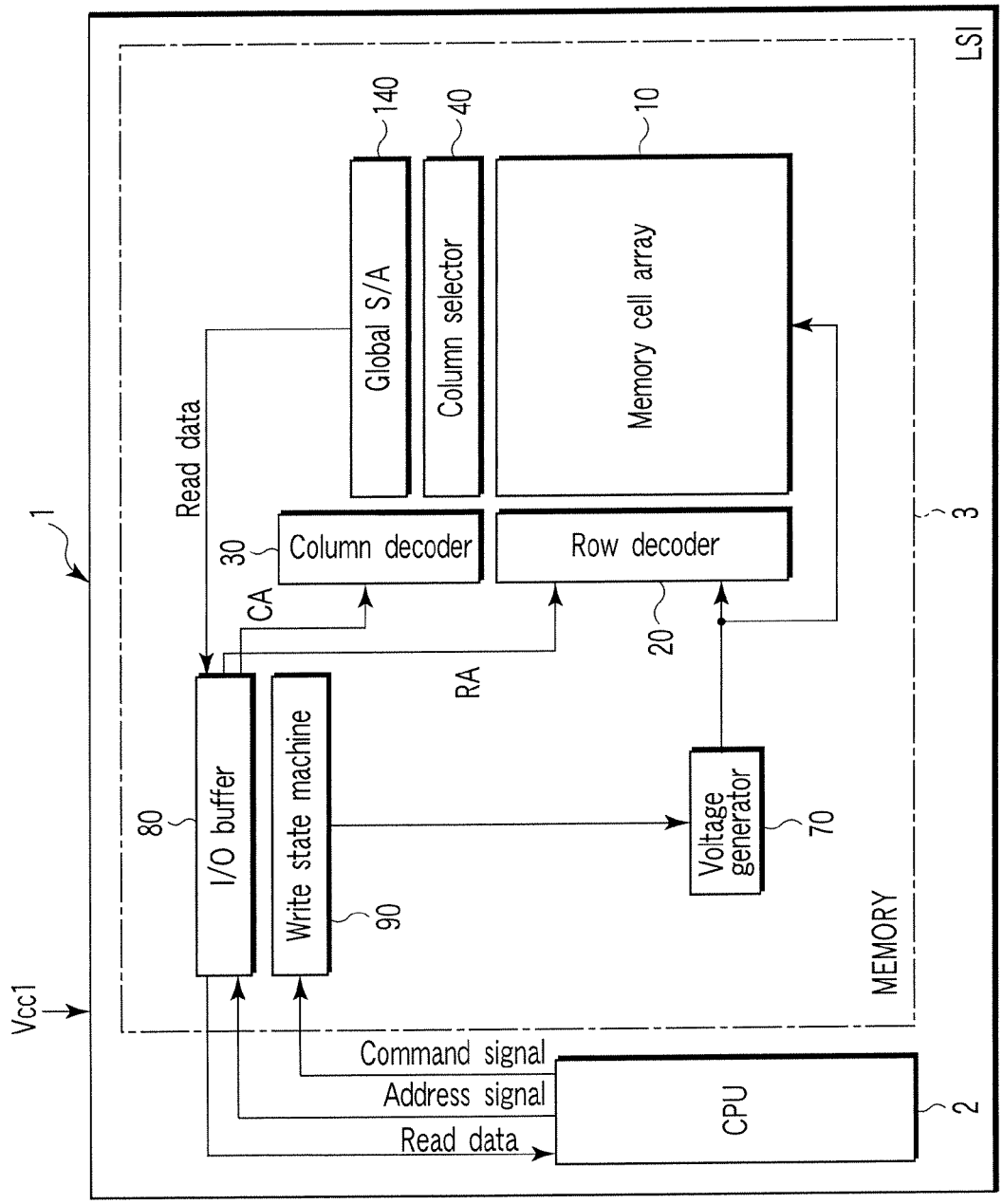
FIG. 14 is a block diagram of a system LSI according to a second embodiment of the present invention.

Next, a semiconductor memory device according to a second embodiment of the present invention and a method of reading data in the semiconductor memory device will be explained. The second embodiment is what is obtained by hierarchizing the bit lines in the first embodiment. FIG. 14 is a block diagram of a system LSI according to the second embodiment.

As shown in FIG. 14, the system LSI according to the second embodiment is so configured that the sense amplifier group 50 and precharge circuit group 60 are eliminated from the configuration of FIG. 1 explained in the first embodiment and a global sense amplifier 140 is newly added. Hereinafter, what differs from the first embodiment will be explained.

Figure 15:
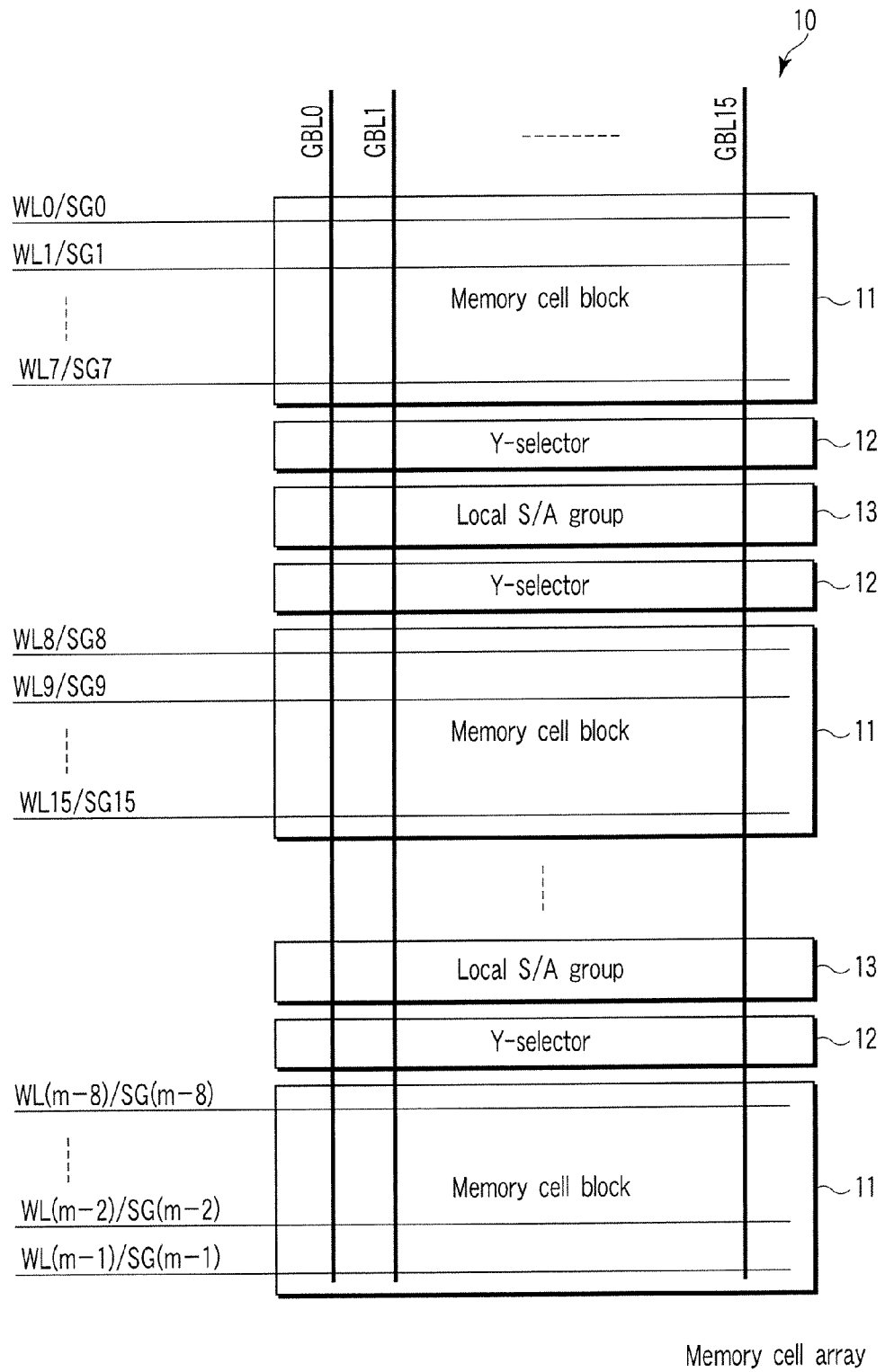
FIG. 15 is a block diagram of a memory cell array included in a 2Tr flash memory according to the second embodiment.

FIG. 15 is a block diagram of the memory cell array 10. As shown in FIG. 15, the memory cell array 10 includes a plurality of memory cell blocks 11, a plurality of Y-selectors 12, and a plurality of local sense amplifier groups 13. The Y-selectors 12 are provided for the memory cell blocks 11 in a one-to-one correspondence. A local sense amplifier group 13 is provided for every two memory cell blocks 11. Then, for example, 16 global bit lines GBL0 to GBL15 are provided so as to connect a plurality of memory cell blocks 11 to one another. In the memory cell array 10, an m number of word lines WL0 to WL(m−1) and an m number of select gate lines SG0 to SG(m−1) are provided in a direction perpendicular to the global bit lines GBL0 to GBL15. In each of the memory cell blocks 11, 8 word lines and 8 select gate lines are provided. Therefore, in one memory cell block 11, word lines WL0 to WL7 and select gate lines SG0 to SG7 are provided. In its adjacent memory cell block 11, word lines WL8 to WL15 and select gate lines SG8 to SG15 are provided. The number of global bit lines is not limited to 16. For instance, it may be 8 or 32 as needs be. Similarly, the number of word lines and the number of select gate lines provided in each memory cell block 11 are not necessarily limited to 8. For instance, they may be 16 or 32.

Figure 16:
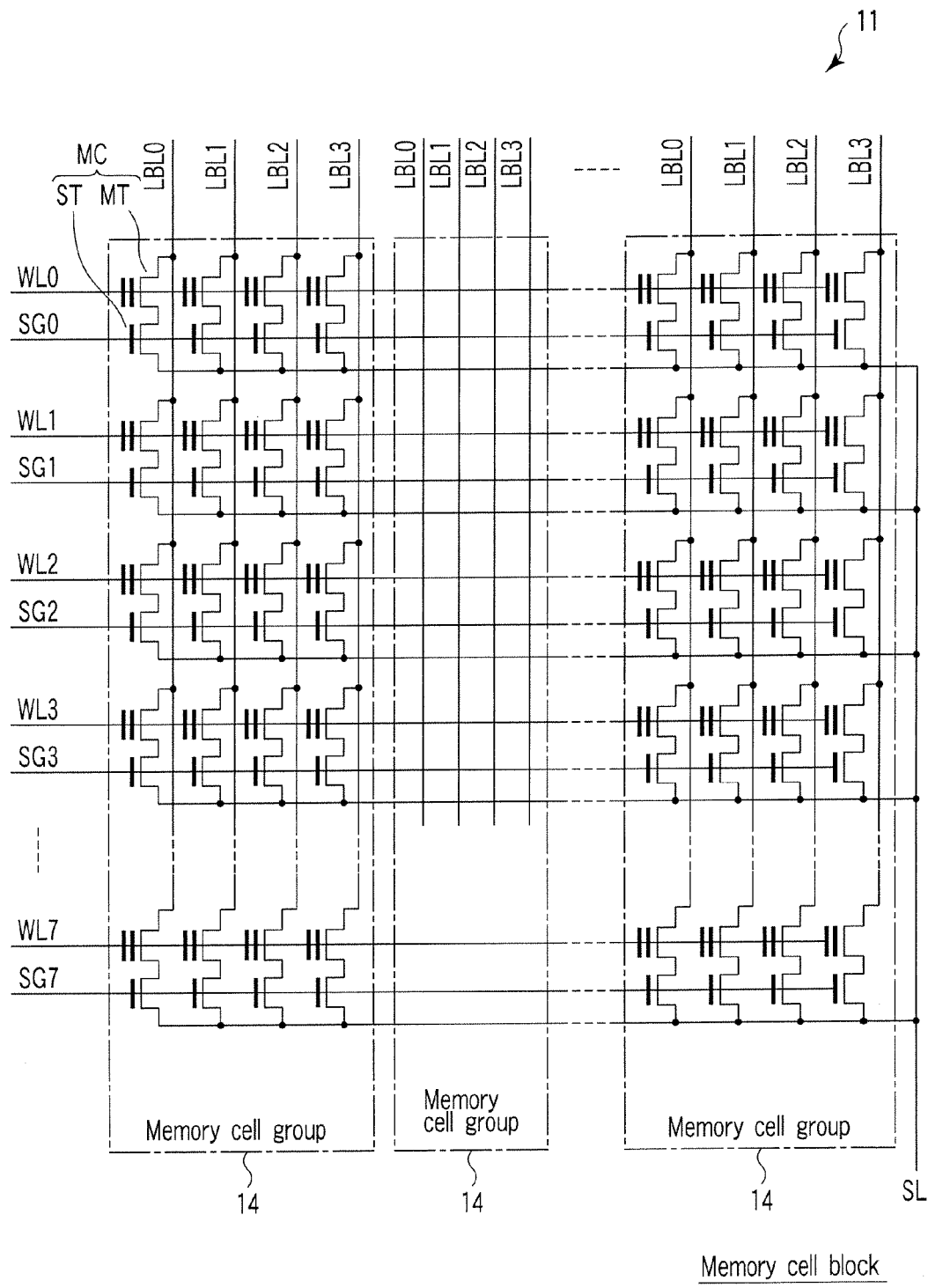
FIG. 16 is a circuit diagram of a memory cell block included in the 2Tr flash memory according to the second embodiment.

Next, the configuration of a memory cell block 11 will be explained using FIG. 16. FIG. 16 is a circuit diagram of a memory cell block 11, especially showing a memory cell block 11 including word lines WL0 to WL7 and select gate lines SG0 to SG7. The configuration of each of the other memory cell blocks 11 is the same as that of FIG. 16, except for the allocated word lines and select gate lines.

As shown in FIG. 16, the memory cell block 11 has as many memory cell groups 14 as there are global bit lines. A memory cell group 14 has (8×4) memory cells MC. The memory cells MC are 2Tr flash memory cells as explained in the first embodiment.

The control gates of the memory cell transistors MT in a same row are connected commonly to any one of word lines WL0 to WL7. The gates of the select transistors ST in a same row are connected commonly to any one of select gate lines SG0 to SG7. The drains of the memory cell transistors MT in a same column are connected commonly to any one of local bit lines LBL0 to LBL3.

Local bit lines LBL0 to LBL3 are provided for each memory cell group and are separated electrically from one another. The word lines and select gate lines connect all of the memory cell groups 14 in the same memory cell block 11 to one another. Then, the sources of all of the select transistors ST in the same memory cell block 11 are connected commonly to the source line SL.

Accordingly, in the example of FIG. 16, since the number of global bit lines is 16, 16 memory cell groups 14 are provided. Thus, the number of local bit lines LBL0 is 16. The same holds true for local bit lines LBL1 and LBL3. The number of local bit lines included in one memory cell group 14 is not limited to 4 and may be 2 or 8.

The sectional configuration of the memory cell block 11 is as shown in FIG. 3 explained in the first embodiment, except that a metal wiring layer functioning as a global bit line is formed, for example, on the interlayer insulating film 113.

Figure 17:
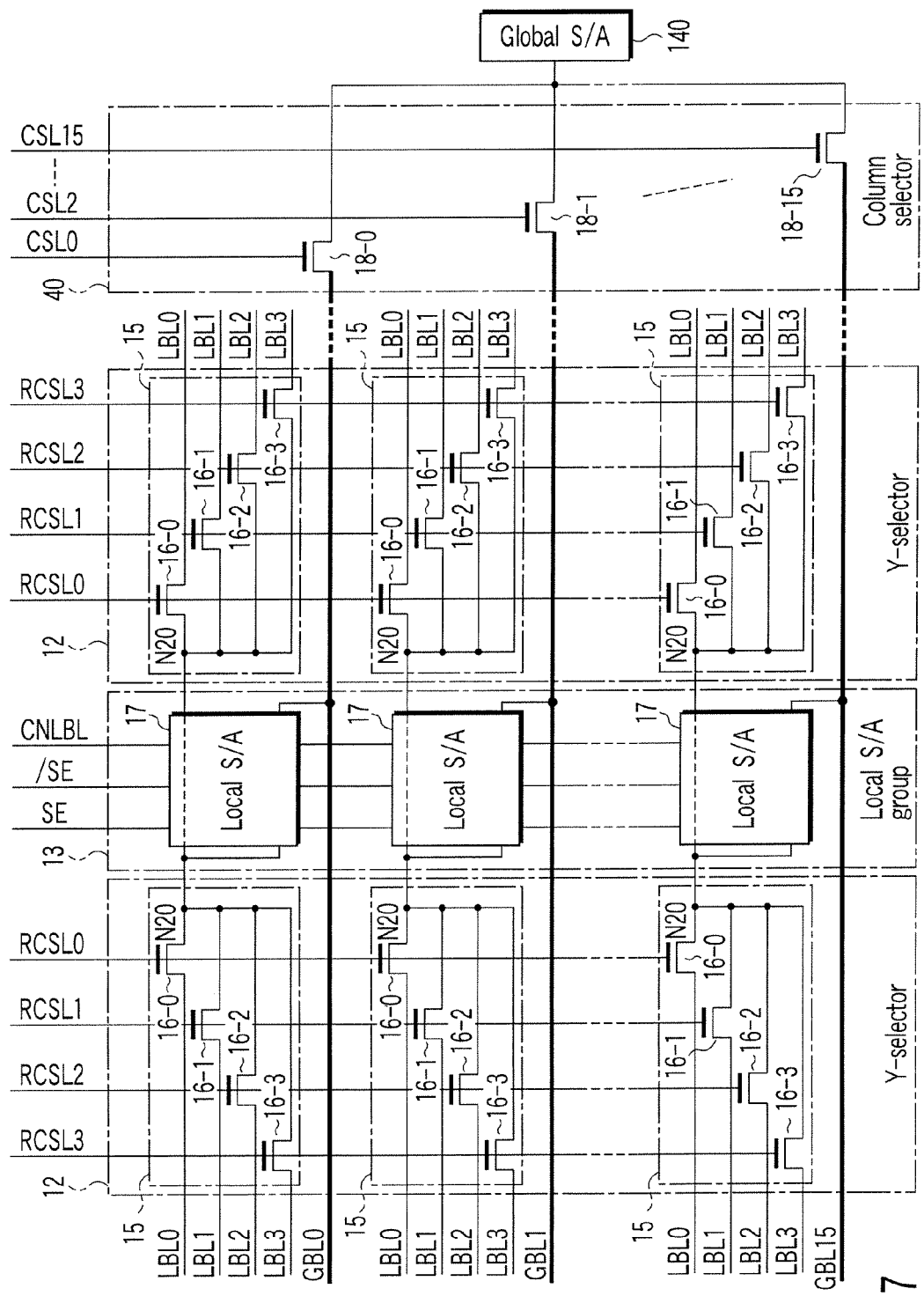
FIG. 17 is a circuit diagram of a Y-selector, a local sense amplifier group, a column selector, and a global sense amplifier included in the 2Tr flash memory according to the second embodiment.

Next, using FIG. 17, the configuration of the Y-selector 12, local sense amplifier group 13, and column selector 40 will be explained. FIG. 17 is a circuit diagram of the Y-selector 12, local sense amplifier group 13, and column selector 40. First, the Y-selector 12 will be explained.

As described above, the Y-selectors 12 are provided for the memory cell blocks 11 in a one-to-one correspondence. As shown in FIG. 17, the Y-selector 12 includes a read select circuit 15 provided for each memory cell group included in the corresponding memory cell block 11. Specifically, the Y-selector 12 includes a read select circuit 15 provided for a set of local bit lines LBL0 to LBL3 in the corresponding memory cell block 11. In other words, the read select circuits 15 are provided for the global bit lines in a one-to-one correspondence. Therefore, when there are 16 global bit lines, the Y-selector 12 has 16 read select circuits 15. Each of the read select circuits 15 has n-channel MOS transistors 16-0 to 16-3 provided for each of the local bit lines LBL0 to LBL3. One end of each of the MOS transistors 16-0 to 16-3 is connected to the local bit lines LBL0 to LBL3 in the corresponding memory cell group 14, respectively. The other ends of the MOS transistors 16-0 to 16-3 are connected to one another at a common junction node. Hereinafter, the common junction node is referred to as node N20. Nodes 20 of the adjacent Y-selectors 12 corresponding to the same global bit line GBL are connected to one another. The gates of the MOS transistors 16-0 to 16-3 are connected commonly to the read column select lines RCSL0 to RCSL3, respectively, in each Y-selector 12.

Next, a local sense amplifier group 13 will be explained. As described above, one local sense amplifier group 13 is provided for every two adjacent memory cell blocks, that is, every two adjacent Y-selectors 12. As shown in FIG. 17, the local sense amplifier group 13 includes local sense amplifiers 17 provided for nodes N20 in the corresponding Y-selector 12 in a one-to-one correspondence. That is, there are as many local sense amplifiers 17 as there are global bit lines. The local sense amplifier 17 connects the corresponding node N20 to any one of the global bit lines GBL0 to GBL15. Thus, each of the global bit lines GBL0 to GBL15 is connected to node N20 by the corresponding local sense amplifier 17. Node N20 is connected to any one of the local bit lines LBL0 to LBL3 by the read select circuit 15. The local sense amplifiers 17 included in the same local sense amplifier group 13 are connected commonly to the same sense amplifier activate signal lines SE, /SE, and the same connect signal line CNLBL.

Next, the column selector 40 will be explained. The column selector 40 selects any one of the global bit lines GBL0 to GBL15. As shown in FIG. 17, the column selector 40 includes n-channel MOS transistors 18-0 to 18-15 provided for global bit lines GBL0 to GBL15 in a one-to-one correspondence. One end of the current path of each of the MOS transistors 18-0 to 18-15 is connected to global bit lines GBL0 to GBL15, respectively. The other ends of the MOS transistors 18-0 to 18-15 are connected to the global sense amplifier 140. The gates of the MOS transistors 18-0 to 18-15 are connected to column select lines CSL0 to CSL15, respectively.

Figure 18:
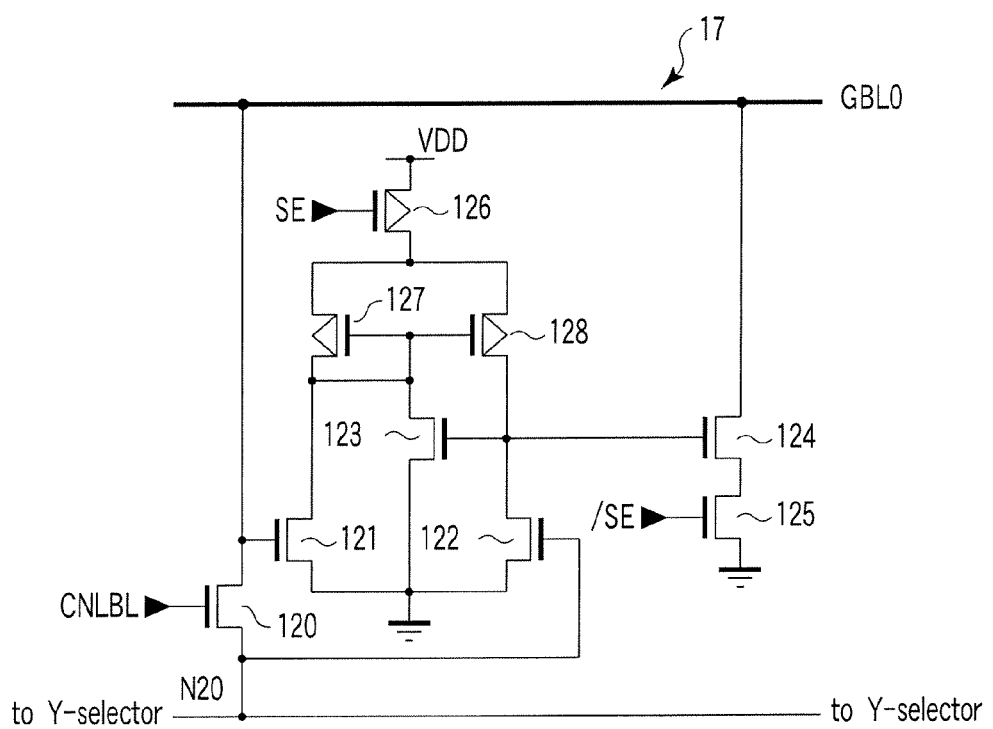
FIG. 18 is a circuit diagram of a local sense amplifier included in the 2Tr flash memory according to the second embodiment.

FIG. 18 is a circuit diagram showing a configuration of the local sense amplifier 17. As shown in FIG. 18, the local sense amplifier 17 has the same configuration as that of the sense amplifier 51 explained in FIG. 5 in the first embodiment. The MOS transistor 120 has its source connected to node N20. The drain of the MOS transistor 120, the gate of the MOS transistor 121, and the drain of the MOS transistor 124 are connected to global bit line GBL0.

The column decoder 30, in a read operation, selects any one of the read column select lines RCSL0 to RCSL3 corresponding to a certain memory cell block 11 on the basis of a column address signal CA and supplies a voltage to the selected read column select line. In addition, the column decoder 30 selects the signal lines SE, /SE, and CNLBL connected to the local sense amplifier 17 corresponding to any one of the memory cell blocks 11 and supplies a voltage to these selected lines. Moreover, the column decoder 30 selects any one of the column select lines CSL0 to CSL15 and supplies a voltage to the selected line.

The column selector 40 connects any one of the global bit lines GBL0 to GBL15 to the global sense amplifier 50 according to the voltage supplied to the column select lines CSL0 to CSL15.

The global sense amplifier 140 not only precharges the global bit lines and the local bit lines in a read operation but also amplifies the read data. The global sense amplifier 140 includes, for example, the precharge circuit 61 explained in the first embodiment and an inverter. The inverter inverts the potential of the global bit line, amplifies the inverted potential, and supplies the amplified potential as output SAOUT.

The remaining configuration is the same as that of the first embodiment.

Next, the operation of the 2Tr flash memory configured as described above will be explained using FIGS. 15 to 18. A write operation and an erase operation are the same as those in the first embodiment by reading the bit lines as the local bit lines. A read operation is the same as that in the first embodiment except for the points described below.

A memory cell from which data is to be read is referred to as a selected memory cell. A memory cell block 11 and a memory cell group 14 which include the selected memory cell are referred to as a selected memory cell block 11 and a selected cell group 14, respectively. A local bit line to which the selected memory cell is connected is referred to as a selected local bit line. A Y-selector 12 and a local sense amplifier group 13 provided so as to correspond to the selected memory cell block 11 are referred to as a selected Y-selector 12 and a selected local sense amplifier group 13, respectively. Then, a case where data is read from the selected memory cell connected to local bit line LBL0 in the selected memory cell group 14 will be explained.

First, the column decoder 30 sets the read column select line RCSL0 connected to the selected Y-selector 12 at the high ("H") level and the read column select lines RCSL1 to RCSL3 at the low ("L") level. In addition, the column decoder 30 sets all of the read column select lines RCSL0 to RCSL3 connected to the unselected Y-selectors 12 at the low ("L") level. As a result, in the selected Y-selector 12, the MOS transistor 16-0 goes into the on state and the MOS transistors 16-1 to 16-3 go into the off state. In the unselected Y-selectors 12, all of the MOS transistors 16-0 to 16-3 go into the off state. Furthermore, the column decoder 30 sets the connect signal line CNLBL connected to the selected local sense amplifier group 13 at the high ("H") level and the connect signal lines CNLBL connected to the unselected local sense amplifier groups 13 at the low ("L") level. Accordingly, in the local sense amplifier 17 included in the selected local sense amplifier group 13, the MOS transistor 120 is turned on. As a result, 16 local bit lines LBL0 connected to the respective memory cell groups 14 in the selected memory cell block 11 are electrically connected via the local sense amplifiers 17 to the global bit lines GBL0 to GBL15, respectively.

Next, the global sense amplifier 140 starts to precharge the global bit line GBL0 and selected local bit line LBL0. That is, the column decoder 30 sets column select line CSL0 at the high ("H") level and column select lines CSL1 to CSL15 at the low ("L") level, thereby turning on the MOS transistor 18-0 and turning off the MOS transistors 18-1 to 18-15 in the column selector 40. As a result, the global sense amplifier 140 and the selected local bit line LBL0 are electrically connected to each other via global bit line GBL0. Then, the global sense amplifier 140 precharges the global bit line GBL0 and selected local bit line LBL0 electrically connected to the global sense amplifier 140. At this time, since the MOS transistors 18-1 to 18-15 are kept in the off state, the global bit lines GBL1 to GBL15 and unselected local bit lines are not precharged.

After the global bit line GBL0 and selected local bit line LBL0 have reached a precharge potential Vpre, the precharge signal /PRE is negated (or set at the high ("H") level), which completes the precharging. Then, with the MOS transistor 120 in the on state, the potential of the selected local bit line LBL0 and that of the global bit line GBL0 are equalized. Thereafter, data is read by the method explained in the first embodiment.

When the data read onto the selected local bit line LBL0 is "0" data, the potential of global bit line GBL0 remains at the precharge potential. Conversely, when the data is "1" data, the global bit line GBL0 is discharged by the MOS transistors 124, 124 and becomes almost 0 V. The way the potential changes is the same as when bit line BL0 is read as the selected local bit line LBL0 and bit line BL00 is read as global bit line GBL0 in FIG. 11 of the first embodiment.

Thereafter, the global sense amplifier 140 amplifies and inverts the data read onto global bit line GBL0 and outputs the resulting data as an output signal SAOUT to the input/output buffer 80.

As described above, the flash memory according to the second embodiment produces not only the effects in items (1) to (3) of the first embodiment but also the effect in item (4) described below.

(4) Power consumption in a read operation can be reduced.

With the flash memory according to the second embodiment, in a read operation, only the local bit line connected to the selected memory cell MC is precharged and the other unselected local bit lines are not precharged. Accordingly, the power consumption in precharging can be reduced. This will be explained in detail below in comparison with a case where the local sense amplifier precharges the local bit lines. FIG. 19 is a circuit diagram of the Y-selector 12, local sense amplifier group 13, column selector 40, and global sense amplifier 140 in the flash memory in a case where the local sense amplifier 150 precharges the local bit lines. FIG. 19 particularly shows the configuration related to global bit lines GBL0, GBL1.

In FIG. 19, each local sense amplifier 150 precharges a local bit line. Precharging is started when the precharge signal /PRE is asserted. At this time, the precharge signal /PRE is shared by a plurality of local sense amplifiers 150 included in a local sense amplifier group 13. Accordingly, when the precharge signal /PRE has been asserted, all the local sense amplifiers 150 included in the same local sense amplifier group 13 carry out precharging. For example, as shown in FIG. 19, when the data is read from the memory cell group 14 corresponding to global bit line GBL0, not only local bit line LBL0 corresponding to global bit line GBL0 but also local bit lines LBL0 corresponding to the other global bit lines GBL1 to GBL15 are also precharged. Local bit lines LBL0 corresponding to global bit lines GBL1 to GBL15 are local bit lines which need not be precharged. As described above, although only one local bit line requires precharging, 16 local bit lines are precharged. As a result, the power consumption in precharging is high. Since the power consumption is high, it is necessary to make power supply lines sufficiently thicker to prevent a drop in the power supply voltage, which causes the problem of increasing the area of the flash memory. Of course, it is conceivable that only the local bit line connected to the selected memory cell MC is precharged by decoding the precharge signal /PRE. In this case, however, an additional decode circuit is needed and therefore the area of the flash memory increases.

Figure 20:
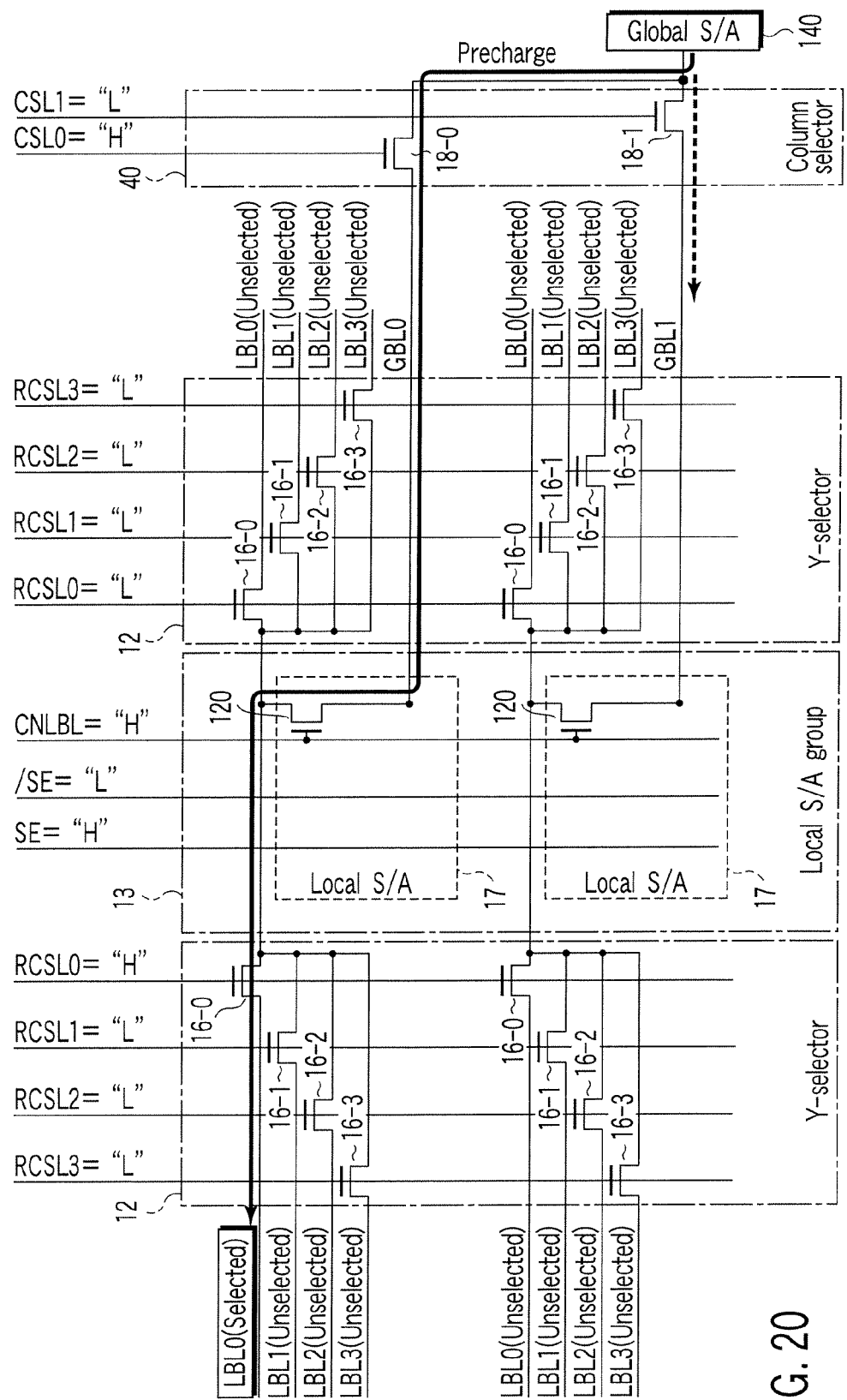
FIG. 20 is a circuit diagram of the Y-selector, local sense amplifier group, column selector, and global sense amplifier included in the 2Tr flash memory according to the second embodiment, showing a precharge operation.

With the configuration of the second embodiment, however, the global sense amplifier 140 carries out precharging. FIG. 20 is a circuit diagram of the Y-selector 12, local sense amplifier group 13, column selector 40, and global sense amplifier 140 in the flash memory of the second embodiment. FIG. 20 particularly shows the configuration related to global bit lines GBL0, GBL1. As shown in FIG. 20, the column selector 40 causes only the selected local sense amplifier group 13 to be connected to global sense amplifier 140. Then, the Y-selector 12 causes only local bit line LBL0 to be connected to the local sense amplifier 17. Specifically, the global sense amplifier 140 is electrically connected only to local bit line LBL0 connected to the selected memory cell via global bit line GBL0, sense amplifier 17, and MOS transistor 16-0 and is not connected to the other local bit lines. Therefore, the unnecessary local bit lines are not precharged, which reduces the power consumption. The reduction in the power consumption enables the power supply lines to be made as thick as conventional equivalents. Moreover, since the decoding of the precharge signal is not needed, the above effect can be achieved without an increase in the area of the decode circuit.

Figure 21:
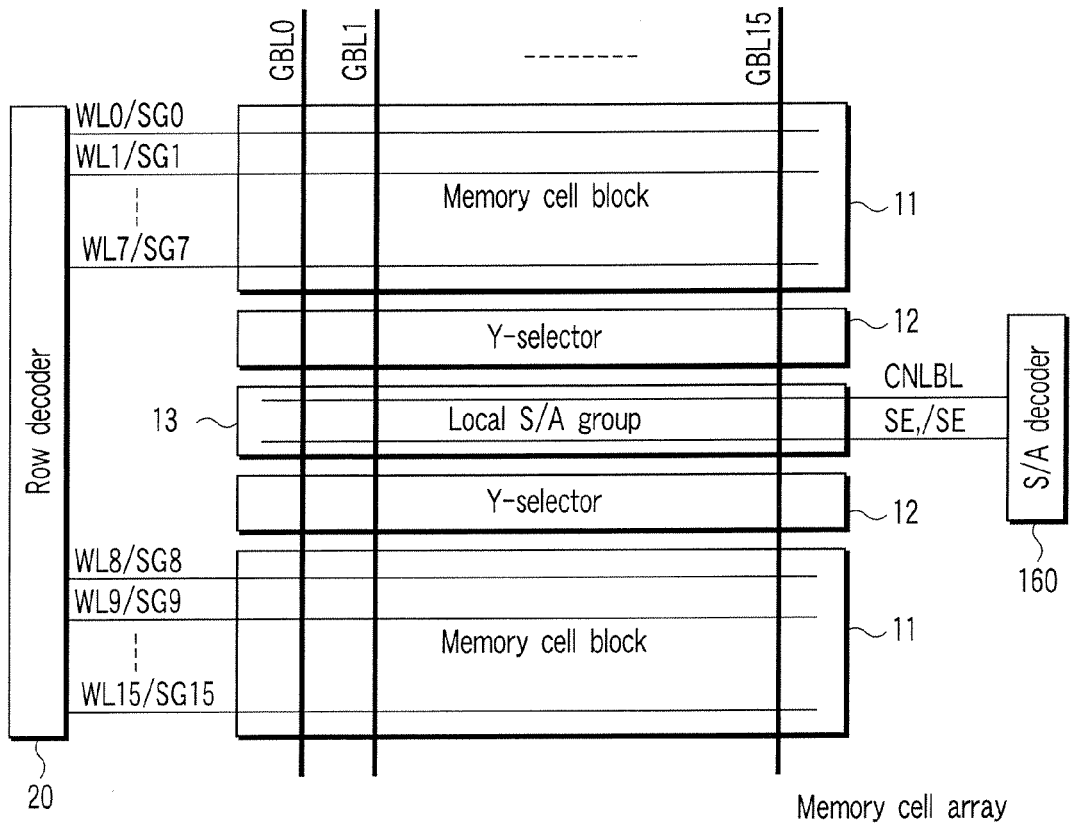
FIG. 21 is a block diagram of a part of a 2Tr flash memory according to a third embodiment of the present invention.

Next, a semiconductor memory device according to a third embodiment of the present invention will be explained. The third embodiment relates to a method of arranging a decode circuit in the second embodiment. FIG. 21 is a block diagram of a part of a flash memory 3 according to the third embodiment.

The flash memory 3 of the third embodiment is such that a sense amplifier decoder 160 is added to the configuration explained in the second embodiment. The sense amplifier decoder 160 carries out the operation of selecting the connect signal line CNLBL and sense amplifier activate signal lines SE, /SE. As shown in FIG. 21, the sense amplifier decoder 160 is provided so as to face the row decoder 20, with the memory cell array 10 being sandwiched between them. In other words, the row decoder 20 is provided so as to select the memory cell connected to global bit line GBL0 faster than the one connected to global bit line GBL15. On the other hand, the sense amplifier decoder 160 is provided so as to select the local sense amplifier 17 connected to global bit line GBL15 faster than the one connected to global bit line GBL0.

The semiconductor memory device of the third embodiment produces not only the effects in item (1) to item (4) explained in the first and second embodiments but also the effect in item (5) explained below.

(5) High-speed reading can be performed (part 2).

Figure 22:
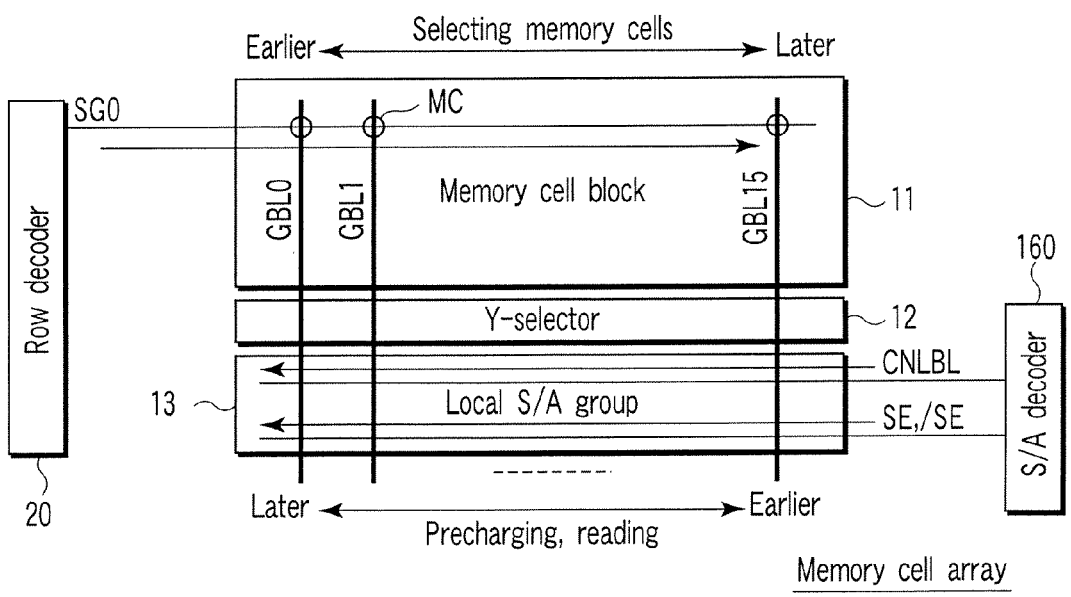
FIG. 22 is a block diagram of a part of the 2Tr flash memory according to the third embodiment.

This effect will be explained using FIG. 22. FIG. 22 is a block diagram of the memory cell block 11, Y-selector 12, local sense amplifier group 13, row decoder 20, and sense amplifier decoder 160. In the configuration of the third embodiment, the functional block (row decoder 20) which selects a select gate line is separated from the functional block (sense amplifier decoder 160) which selects the connect signal line CNLBL and sense amplifier activate signal lines SE, /SE. These functional blocks are arranged so as to face each other in a direction along the word line, with the memory cell array 10 being sandwiched between them.

Then, as shown in FIG. 22, the global bit line closest to the row decoder 20 is global bit line GBL0 and the global bit line farthest from the row decoder 20 is global bit line GBL15. Accordingly, when a memory cell MC is selected, the memory cell MC connected to global bit line GBL0 is selected earliest and the memory cell MC connected to global bit line GBL15 is selected latest. Therefore, the memory cell MC connected to global bit line GBL0 starts to discharge the local bit line earliest and the memory cell MC connected to global bit line GBL15 starts to discharge the local bit line latest.

Furthermore, the global bit line closest to the sense amplifier decoder 160 is global bit line GBL15 and the global bit line farthest from the sense amplifier decoder 160 is global bit line GBL0. Accordingly, when the global bit line is disconnected from the local bit line, global bit line GBL15 is disconnected earliest and global bit lien GBL0 is disconnected latest. Similarly, as for the MOS transistors 125, 126 in the local sense amplifier 17, the MOS transistors 125, 126 corresponding to global bit line GBL15 are turned on earliest and the MOS transistors 125, 126 corresponding to global bit line GBL0 are turned on latest. That is, those corresponding to global bit line GBL15 are earlier than those corresponding to global bit line GBL0 in terms of the completion of precharging of the local bit line and the timing of the local sense amplifier 17 being activated.

Therefore, a propagation delay in the select signal of the select gate line is offset by a propagation delay in the select signal of the connect signal line CNLBL and sense signal line LSAON, which suppresses a decrease in the operation speed due to a propagation delay in the signal.

Next, a semiconductor memory device according to a fourth embodiment of the present invention will be explained. The fourth embodiment is such that the row decoder 20 and column decoder 30 are divided into a read part and a write part in the second embodiment and then the third embodiment is applied. FIG. 23 is a block diagram of a flash memory 3 according to the fourth embodiment.

As shown in FIG. 23, with the configuration of the fourth embodiment, a read row decoder 22 and a write row decoder 23 are provided as the row decoder 20 explained in the first embodiment. In addition, a connect signal line decoder 24, a sense amplifier activate signal line decoder 25, a reset signal line decoder 26, a read column decoder 27, and a write column decoder 28 are provided as the column decoder 30. The remaining configuration is the same as that of FIG. 1.

On the basis of a row address signal RA, the write row decoder 23 selects word lines WL0 to WL(m−1) in a write operation and an erase operation and applies a positive voltage VPP or a negative voltage VBB to the selected word line. The write row decoder 23 further applies a voltage to a p-well region 102 in which the memory cell array 10 has been formed. On the basis of the row address signal RA, the read row decoder 24 selects select gate lines SG0 to SG(m−1) in a read operation and applies a positive voltage Vcc1 to the selected select gate line. The connect signal line decoder 24, sense amplifier activate signal line decoder 25, and reset signal line decoder 26 control the connect signal line CNLBL, sense amplifier activate signal lines SE, /SE, and reset signal line LBLRST, respectively. On the basis of a column address signal CA, the read column decoder 27 selects any one of the read column select lines RCSL in a read operation. On the basis of the column address signal CA, the write column decoder 28 controls the Y-selector 12 in a write operation. The select operation of the write column decoder 28 will be explained later.

In the above configuration, the read row decoder 22 is arranged so as to face the write row decoder 23 in a direction along the word line, with the memory cell block 11 being sandwiched between them. The connect signal line decoder 24 and sense amplifier activate signal line decoder 25 are arranged close to the write row decoder 23. That is, the connect signal line decoder 24 and sense amplifier activate signal line decoder 25 are arranged so as to face the read row decoder 22 in a direction along the word line, with the memory cell array 10 being sandwiched between them. In the example of FIG. 23, the flash memory 3 has two memory cell arrays 10. The write row decoder 23, write column decoder 28, connect signal line decoder 24, and sense amplifier activate signal line decoder 25 are arranged between the two memory cell arrays 10 and carry out a select operation for the two memory cell arrays 10.

Figure 24:
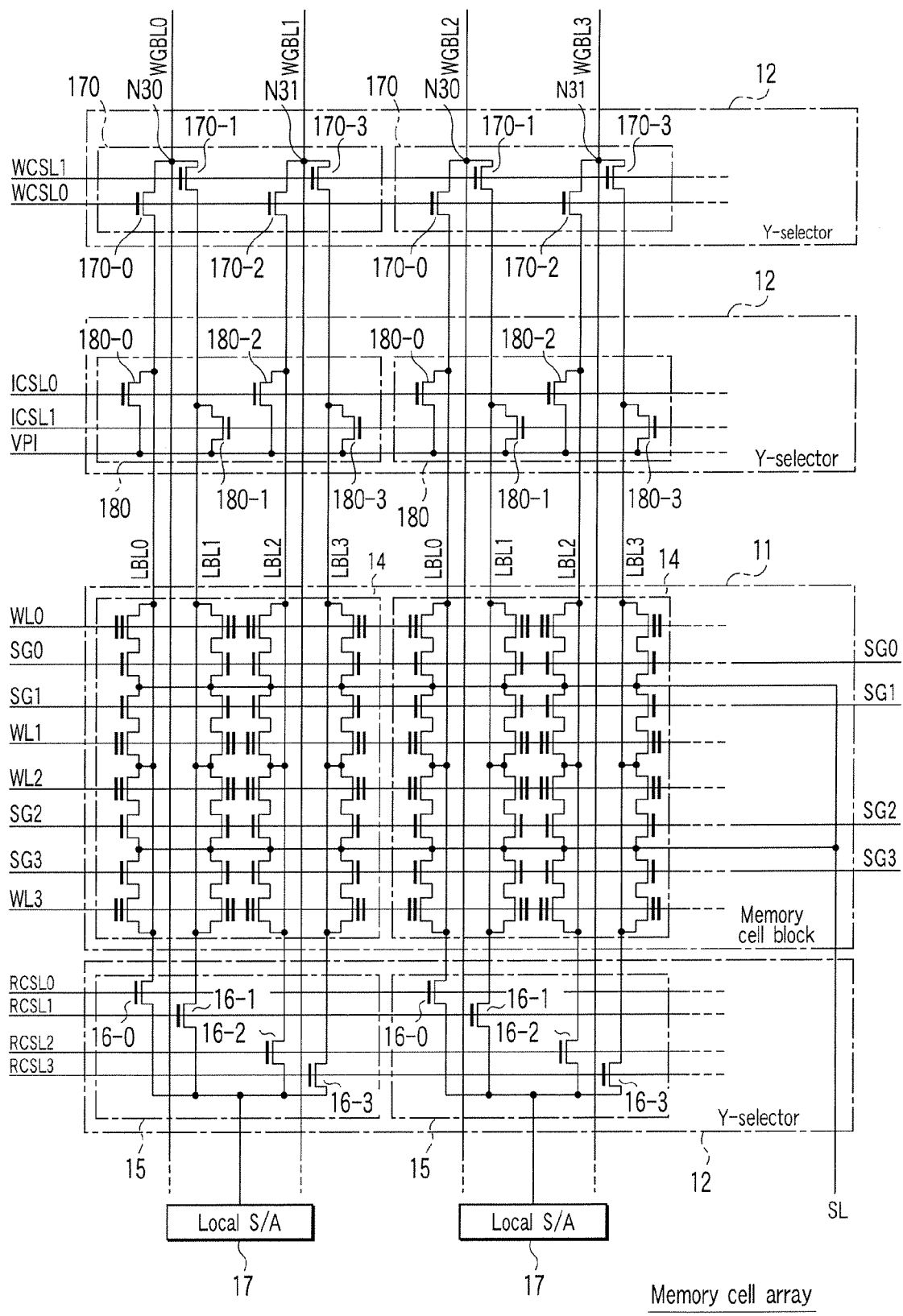
FIG. 24 is a circuit diagram of the memory cell array included in the 2Tr flash memory according to the fourth embodiment.

Next, the configuration of the Y-selector 12 included in the flash memory of the fourth embodiment will be explained using FIG. 24. FIG. 24 is a circuit diagram of the memory cell block 11 and Y-selector 12. The configuration of the memory cell block 11 is the same as that of the second embodiment. Although in FIG. 24, the number of memory cells MC connected to one local bit line is 4, this is illustrative and not restrictive.

As shown in FIG. 24, the Y-selector 12 includes not only the read select circuit 15 explained in the first embodiment but also a write select circuit 170 and a write inhibit select circuit 180. The write select circuit 170 and write inhibit select circuit 180 are provided for each memory cell group 14 as is the read select circuit 15.

Each of the write select circuits 170 includes four MOS transistors 170-0 to 170-3. One end of the current path of each of the MOS transistors 170-0 to 170-3 is connected to one end of the corresponding one of the local bit lines LBL0 to LBL3, respectively. The other ends of the current paths of the MOS transistors 170-0 and 170-1 are connected to each other at a common junction node and the other ends of the current paths of the MOS transistors 170-2 and 170-3 are connected to each other at a common junction node. Hereinafter, the common junction node of the MOS transistors 170-0 and 170-1 is referred to as node N30 and the common junction node of the MOS transistors 170-2 and 170-3 is referred to as node N31. The gates of the MOS transistors 170-0 to 170-3 are connected to either write column select line WCSL0 or WCSL1. The MOS transistors 170-0, 170-2 included in the write select circuit 170 in the same row are connected to the same write column select line WCSL0 and the MOS transistors 170-1, 170-3 included in the write select circuit 170 in the same row are connected to the same write column select line WCSL1. The write column select lines WCSL0, WSCL1 are selected by the write column decoder 28 in a write operation.

Each of node N30 and node N31 in the write select circuit 170 is connected to any one of the write global bit lines WGBL0 to WGBL31. Each of the write global bit lines WGBL0 to WGBL31 connects nodes N30 or nodes N31 in the write select circuits 170 in the same column to one another. In a write operation, the write data is supplied to the write global bit lines WGBL0 to WGBL31.

Next, the configuration of the write inhibit select circuit 180 will be explained. Each of the write inhibit select circuits 180 includes four MOS transistors 180-0 to 180-3. One end of the current path of each of the MOS transistors 180-0 to 180-3 is connected to the corresponding one of the local bit lines LBL0 to LBL3, respectively. Then, a write inhibit voltage VPI is applied commonly to the other ends of the current paths of the MOS transistors 180-0 to 180-3. The gates of the MOS transistors 180-0 to 180-3 are connected to either write inhibit column select line ICSL0 or ICSL1. The gates of the MOS transistors 180-0, 180-2 included in the write inhibit select circuit 180 in the same row are connected to the same write column select line ICSL0 and the gates of the MOS transistors 180-1, 180-3 included in the write inhibit select circuit 180 in the same row are connected to the same write column select line ICSL1. Write inhibit column select lines ICSL0, ICSL1 are selected by the write column decoder 28 in a write operation.

The global bit lines GBL0 to GBL15 explained in the second embodiment function as read global bit lines RGBL which are used in a read operation and not used in a write operation.

Next, the configuration of the read row decoder 22 and write row decoder 23 will be explained using FIG. 25. FIG. 25 is a circuit diagram of the read row decoder 22, write row decoder 23, and memory cell array 10. In a write operation, the write row decoder 23 applies a negative voltage VBB to the p-well region 102 in which the memory cell array has been formed and to all of the select gate lines SG0 to SG(m−1). In an erase operation, the write row decoder 23 applies not only the negative voltage VBB to all of the word lines but also a positive voltage VPP to the p-well region 102. The read row decoder 22 selects any one of the select gate lines SG0 to SG(m−1) in a read operation and applies a positive potential Vcc1 to the selected select gate line.

The configuration of the read row decoder 22 and write row decoder 23 will be explained. First, the configuration of the read row decoder 22 will be explained. The read row decoder 22 includes an address decode section 190 and a switch element group 191. The address decode section 190 operates on the power supply voltage Vcc1. The address decode section 190 is provided for each select gate line SG, and includes a row address decode circuit 192 which decodes (I+1)-bit row address signals RA0 to RAi, thereby producing a row address decode signal. The row address decode circuit 192 includes a NAND gate 193 and an inverter 194. The NAND gate 193 carries out a NAND operation on each bit in the row address signals RA0 to RAi. Then, the inverter 194 inverts the result of the NAND operation and outputs the result as a row address decode signal.

The switch element group 191 has an n-channel MOS transistor 195. The MOS transistors 195 are provided for the select gate lines SG0 to SG(m−1) in a one-to-one correspondence. Then, the output of the inverter 194 is supplied via the current path of the MOS transistor 195 to the select gate lines SG0 to SG(m−1). A control signal ZISOG is input to the gate of the MOS transistor 195. Then, the control signal ZISOG turns off the MOS transistor 195 in a write operation and an erase operation and turns on the MOS transistor 195 in a read operation.

Next, the configuration of the write row decoder 23 will be explained. The write row decoder 23 includes an address decode section 200 and a switch element group 201. The address decode section 200 includes a row address decode circuit 202 which is provided for each of the word lines WL0 to WL(m−1) and which decodes (i+1)-bit row address signals RA0 to RAi, thereby producing a row address decode signal. The row address decode circuit 202 includes a NAND gate 203 and an inverter 204. The NAND gate 203 carries out a NAND operation on each bit in the row address signals RA0 to RAi. Then, the inverter 204 inverts the result of the NAND operation and outputs the result as a row address decode signal. The power supply voltages of the NAND gate 203 and inverter 204 are supplied from VCGNW node and VCGPW node. To VCGNW node, 0 V or the positive voltage VPP is applied. To VCGPW node, 0 V or the negative voltage VBB is applied.

The switch element group 201 has an n-channel MOS transistor 205. The MOS transistors 205 are provided for the select gate lines SG0 to SG(m−1) in a one-to-one correspondence. The select gate lines SG0 to ST(m−1) are connected via the current path of the MOS transistor 205 to VSGPW node. To VSGPW, the negative voltage VBB is applied.

Next, the operation of the 2Tr flash memory configured as described above will be explained. Only what differs from the first and second embodiments will be explained below.

Write Operation

Data is written simultaneously into a plurality of memory cells MC connected to the same word line. In the same memory cell group 14, the memory cells into which data is written simultaneously are the following two: the memory cell connected to either local bit line LBL0 or LBL1 and the memory cell connected to either local bit line LBL2 or LBL3. Hereinafter, in FIG. 24, focusing on the memory cell groups connected to the write global bit lines WGBL0, WGBL1, explanation will be given using a case where data is written into the memory cell transistors MT connected to word line WL0 and local bit lines LBL0, LBL2.

First, 0 V is supplied as a write inhibit voltage VPI. Then, the write row decoder 23 selects word line WL0 and applies the positive voltage VPP to the selected word line WL0. In addition, the negative voltage VBB is applied to WSGPW node. Then, in the write row decoder 23, the MOS transistor 205 is turned on, which causes the negative potential VBB to be applied from VSGPW node to all of the select gate lines SG0 to SG(m−1). Moreover, the write row decoder 23 applies the negative potential VBB to the p-well region 102. In the write operation, the signal ZISOG is set at the low ("L") level and the row address decode circuit 192 of the read row decoder 22 is separated electrically from the select gate line.

Of the two write column select lines connected to the write select circuit 170 corresponding to the memory cell block 14 including the selected word line WL0, the write column select line WCSL0 is selected by the write column decoder 28. This turns on the MOS transistors 170-0, 170-2 in the write select circuit 170. As a result, write global bit line WGBL0 and local bit line LBL0 are connected electrically to each other and write global bit line WGBL1 and local bit line LBL2 are connected electrically to each other.

Moreover, all of the write column select lines connected to the write select circuit 170 corresponding to the memory cell group 14 not including the selected word line WL0 are made unselected. Therefore, the MOS transistors 170-0 to 170-3 in the write select circuit 120 corresponding to the memory cell group 14 not including the selected word line WL0 are turned off.

Furthermore, the read column decoder 27 makes unselected all of the read column select lines RCSL0 to RCSL(4m−1), which turns off the MOS transistors 16-1 to 16-3 in all of the read select circuits 15. Consequently, the read global bit line RGBL is separated electrically from the local bit lines LBL0 to LBL3.

In addition, to turn on the MOS transistors 180-1, 180-3 connected to the local bit lines LBL1, LBL3 made unselected, the write column decoder 28 sets write inhibit column select line ICSL1 at the high ("H") level (Vcc2). The write column decoder 28 sets write inhibit column select line ICSL0 connected to the MOS transistors 180-0, 180-2 corresponding to the selected local bit lines LBL0, LBL2 at the low ("L") level, turning off the MOS transistors 180-0, 180-2. As a result, the write inhibit voltage VPI (=0 V) is applied to the unselected local bit lines LBL1, LBL3.

Consequently, the write data (VBB or 0 V) is supplied from write global bit line WGBL0 to local bit line LBL0 via the MOS transistor 170-0 in the write select circuit 170. In addition, the write data (VBB or 0 V) is supplied from write global bit line WGBL1 to local bit line LBL2 via the MOS transistor 170-2.

Read Operation

Next, a read operation will be explained. In a read operation, the write column decoder 28 makes all of the write column select lines WCSL0, WCSL0 unselected and further all of the write inhibit column select liens ICSL0, ICSL1 unselected. As a result, the local bit lines LBL0 to LBL3 are disconnected from the write global bit line and the write inhibit voltage VPI.

Then, after the potential on the read global bit line has reached a specific precharge potential, the signal ZISOG is set at the high ("H") level and the MOS transistor 156 of the read row decoder 22 is turned on. Then, the read row decoder 22 selects the select gate line SG0 ("H" level: Vcc1). In addition, the write row decoder 23 makes all of the word lines WL0 to WL(m−1) unselected (0 V) and sets the potential VPW in the p-well region 102 at 0 V. Moreover, the potential on the source line is set at 0 V. In the read operation, a signal WSG is set at the low ("L") level and VSGPW node is separated electrically from the select gate line.

The other operations are the same as explained in the second embodiment.

Erase Operation

Next, an erase operation will be explained. In an erase operation, all of the MOS transistors 16-0 to 16-3, 170-0 to 170-3, 180-0 to 180-3 are turned off. Then, the write row decoder 23 applies the negative voltage VBB to all of the word lines WL0 to WL(m−1). Furthermore, the write row decoder 23 applies the positive potential VPP to the p-well region 102. In the erase operation, the signals ZISOG, WSG are set at the low ("L") level.

As a result, electrons are drawn out of the floating gates of the memory cell transistors in the memory cells MC into the p-well region 102 by FN tunneling. As a result, the data in all of the memory cells MC are erased, which makes the threshold voltage negative. The potential of the select gate line rises to almost VPP by coupling with the p-well region 102. Of course, the negative voltage VBB may be applied from VSGPW node to the select gate lines SG0 to SG(m−1).

As described above, the first to third embodiments can be applied to the configuration where the row decoder is divided into a write row decoder and a read row decoder.

Next, a semiconductor memory device according to a fifth embodiment of the present invention will be explained. The fifth embodiment relates to a configuration for a test operation of an LSI according to the first to fourth embodiments. FIG. 26 is a block diagram of a part of the flash memory 3.

As shown in FIG. 26, the output node SAOUT of a global sense amplifier 140 is connected to a test monitor terminal 210. The test monitor terminal 210 is used to measure, for example, a cell current flowing in a memory cell MC in testing the operation of the flash memory 3.

The configuration of the fifth embodiment produces the effects explained in item (1) to item (5) explained in the first to fifth embodiments but also the effect in item (6) described below.

(6) It is possible to simplify a test operation, while suppressing an increase in the area of the LSI.

When not only a global sense amplifier but also a local sense amplifier is used, a test operation is usually complicated as compared with a case where no local sense amplifier is used. The reason is that the local sense amplifier has a precharging function. For example, when a cell current is measured in a test operation, the global bit line cannot be used. Therefore, the local sense amplifier is provided with an external output transistor and external output metal wires. Using the transistor and metal wires, a test signal is input and output. Accordingly, a new circuit for a test is required, contributing to an increase in the area of the LSI.

With the configuration of the fifth embodiment, however, precharging is carried out by the global sense amplifier 140. Therefore, in a test operation, a test signal can be supplied and read using the global bit line. For example, when a cell current is read, the cell current is read to the test monitor terminal 210 via the Y-selector 12, local sense amplifier 17, and global bit line. That is, a test can be conducted using the same method as in an ordinary data read operation. Since a new circuit for a test need not be added, it is possible to simplify a test operation, while suppressing an increase in the area of the LSI.

Figure 27:
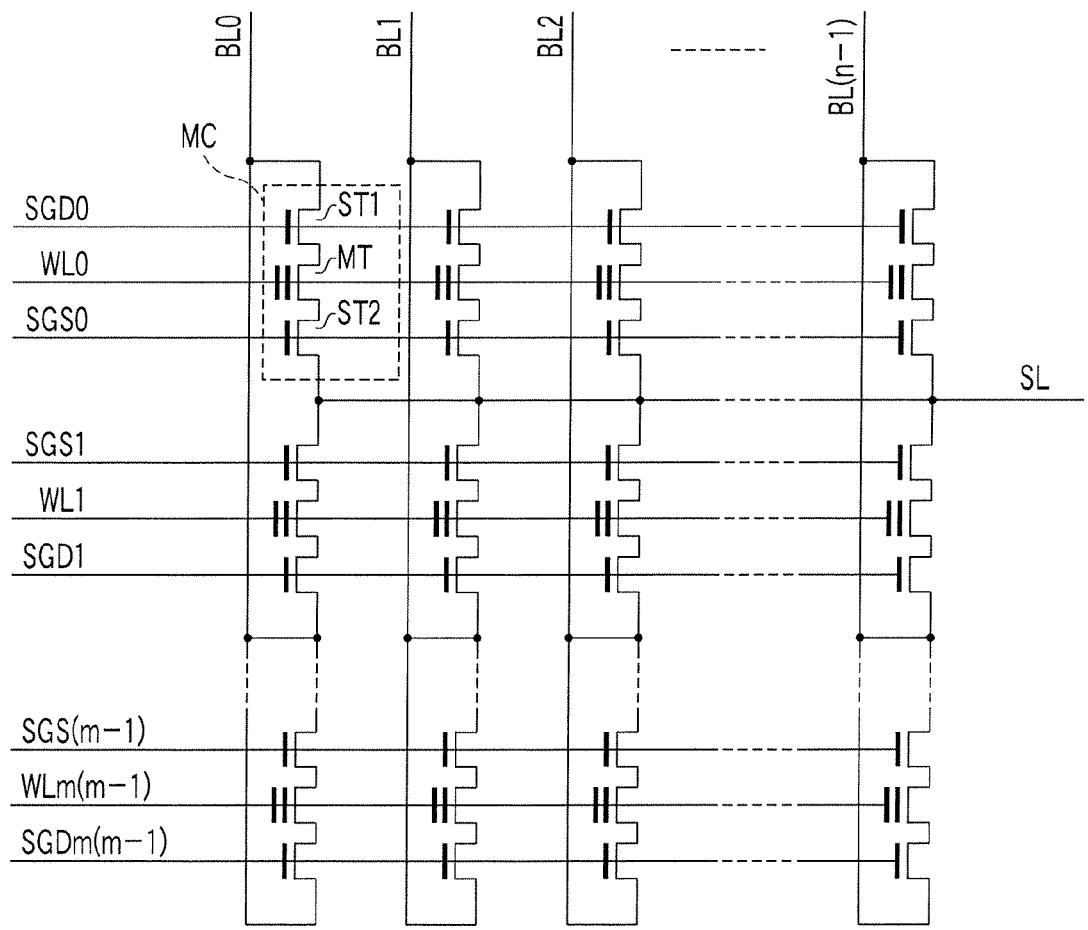
FIG. 27 is a circuit diagram of a memory cell block included in a flash memory according to a sixth embodiment of the present invention.

Next, a semiconductor memory device according to a sixth embodiment of the present invention will be explained. The sixth embodiment is such that a 3Tr-NAND flash memory is used in place of the 2Tr flash memory in the first to fifth embodiments. FIG. 27 is a circuit diagram of a memory cell array 10 of a 3Tr-NAND flash memory. Since the remaining configuration is the same as that explained in the first to fifth embodiment, its explanation will be omitted.

As shown in FIG. 27, the memory cell array has (m×n) memory cells MC arranged in a matrix. Each of the memory cell MCs includes a memory cell transistor MT and select transistors ST1, ST2, which have their current paths connected in series with one another. The current path of the memory cell transistor MT is connected between the current paths of the select transistors ST1, ST2. The memory cell transistor MT has a stacked gate structure that includes a charge accumulation layer (or floating gate) formed on a semiconductor substrate with a gate insulating film interposed therebetween and a control gate formed on the floating gate with an inter-gate insulating film interposed therebetween. Each of the select transistors ST1, ST2 has a multilayer gate structure that includes a first polysilicon layer formed above the semiconductor substrate with a gate insulating film interposed therebetween and a second polysilicon layer formed on the first polysilicon layer with an inter-gate insulating film interposed therebetween. The source region of the select transistor ST1 is connected to the drain region of the memory cell transistor MT. The source region of the memory cell transistor MT is connected to the drain region of the select transistor ST2. Memory cells MC adjoining each other in the column direction share the drain region of the select transistor ST1 or the source region of the select transistor ST2.

The control gates of the memory cell transistors MT of the memory cells MC in a row are connected equally to any one of the word lines WL0 to WL(m−1). The gates of the select transistors ST1 of the memory cells MC in a row are connected equally to any one of select gate lines SGD0 to SGD (m−1). The gates of the select transistors ST2 are connected equally to any one of select gate lines SGS0 to SGS(m−1). The drain regions of the select transistors ST1 of the memory cell MCs in a column are connected equally to any one of local bit lines LBL0 to LBL3. The source regions of the select transistors ST2 of the memory cells MC are connected equally to the source line SL.

Even to the 3Tr-NAND flash memory, the first to fifth embodiments can be applied.

Figure 28:
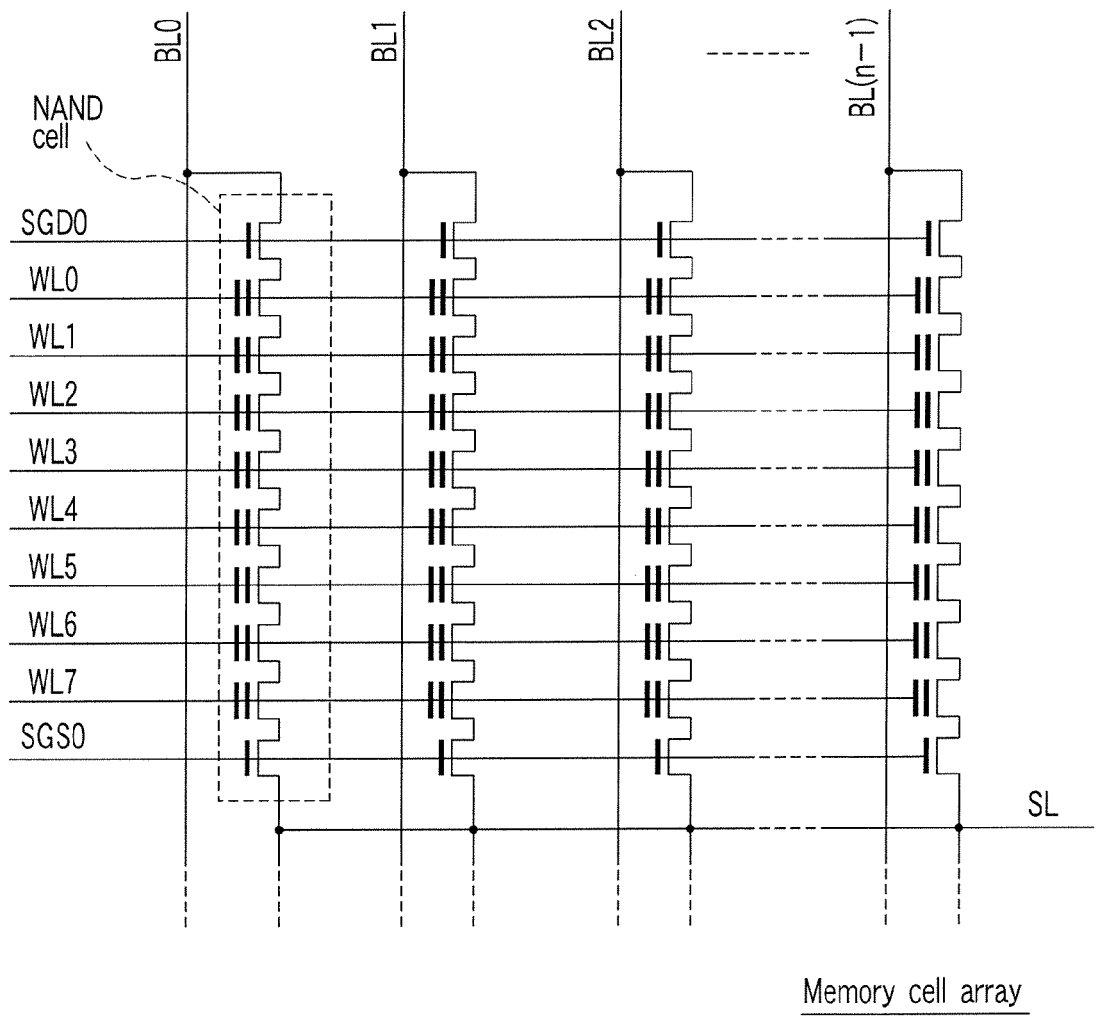
FIG. 28 is a circuit diagram of a memory cell block included in a flash memory according to a seventh embodiment of the present invention.

Next, a semiconductor memory device according to a seventh embodiment of the present invention will be explained. The seventh embodiment is such that a NAND flash memory is used in place of the 2Tr flash memory in the first to fifth embodiments. FIG. 28 is a circuit diagram of a memory cell array of a NAND flash memory. Since the remaining configuration is the same as that explained in the first to fifth embodiment, its explanation will be omitted.

The memory cell array has a plurality of NAND cells arranged in a matrix. Each of the NAND cells includes eight memory cell transistors MT and select transistors ST1, ST2. A memory cell transistor MT has a stacked-gate structure that includes a charge accumulation layer (or floating gate) formed on a semiconductor substrate with a gate insulating film interposed therebetween and a control gate formed on the floating gate with an inter-gate insulating film interposed therebetween. The number of memory cell transistors MT is not limited to 8 and may be 16 or 32. The number is illustrative and not restrictive. The adjoining ones of the memory cell transistors MT share their source and drain. They are arranged in such a manner that their current paths are connected in series between the select transistors ST1, ST2. The drain region at one end of the series connection of the memory cell transistors MT is connected to the source region of the select transistor ST1. The source region at the other end of the series connection is connected to the drain region of the select transistor ST2. That is, a NAND cell is such that a plurality of memory cell transistors MT are used in a memory cell of a 3Tr-NAND flash memory.

The control gates of the memory cell transistors MT in a row are connected equally to any one of word lines WL0 to WL7. The gates of the select transistors ST1, ST2 of the memory cells in the same row are connected to select gate lines SGD, SGS, respectively. The drains of the select transistors ST1 in a column in the memory cell array are connected equally to any one of bit lines BL0 to BL3. The sources of the select transistors ST2 are connected equally to the source line SL. Both of the select transistors ST1, ST2 are not necessarily needed. Only one of them may be provided, provided that it can select a NAND cell.

Even to the NAND flash memory, the first to fifth embodiments can be applied.

As described above, with the semiconductor memory device and the method of reading data in the memory device according to the first to seventh embodiments, the voltage of the precharged bit line is used as the reference voltage of the sense amplifier. Accordingly, a reference voltage generator circuit is not needed and therefore the area of the semiconductor memory can be reduced. While in the embodiments, the explanation has been given using the flash memory, the embodiment may be applied to almost all semiconductor memories that read data by sensing a cell current. For instance, the embodiment may be applied to DRAMs, MRAMs, and ferroelectric memories.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array in which memory cells are arranged;
   a bit line which connects commonly the memory cells in the same column;
   a precharge circuit which applies a precharge potential to the bit line in reading data; and
   a first sense amplifier which amplifies data read onto the bit line and which determines the data read on the bit line using as a reference potential the precharge potential applied to the bit line by the precharge circuit,
   the first sense amplifier including:
   a first current source which is connected to the bit line and supplies a current according to the potential of the bit line,
   a switch element which connects the bit line and the precharge circuit, and
   a second current source which is connected via the switch element to the bit line and supplies a current according to the potential of the bit line.

2. The device according to claim 1, wherein
   the first current source has a higher current driving capability than that of the second current source, and
   the data is distinguished according to the difference between an amount of the current supplied by the first current source and an amount of the current supplied by the second current source.

3. The device according to claim 2, wherein the first sense amplifier further includes
   a first MOS transistor of a first conductivity type which has one end of a current path connected to a power supply potential,
   a second MOS transistor of the first conductivity type which has one end of a current path connected to the power supply potential and which has a gate connected to another end of the current path and to a gate of the first MOS transistor and which, together with the first MOS transistor, forms a current mirror circuit, and
   a third MOS transistor of a second conductivity type which has a gate connected to another end of the current path of the first MOS transistor and which has one end of a current path connected to the gates of the first and second MOS transistors, the first current source includes a fourth MOS transistor of the second conductivity type which has one end a current path connected to the another end of the current path of the first MOS transistor and which has a gate connected to the bit line, and the second current source includes a fifth MOS transistor of the second conductivity type which has one end of a current path connected to the another end of the current path of the second MOS transistor and which has a gate connected via the switch element to the bit line.

4. The device according to claim 2, further comprising a second sense amplifier, wherein the bit line includes first bit lines each of which connects commonly the memory cells in the same column, and a second bit line which connects commonly two or more of the first bit lines via the switch element, the first current source supplies a current according to the potential of the first bit line, the second current source supplies a current according to the potential of the second bit line, the first sense amplifier discharges the second bit line according to the difference between an amount of the current supplied by the first current source and that supplied by the second current source, and the second sense amplifier includes the precharge circuit and precharges the first bit line via the second bit line and the first sense amplifier and amplifies the potential of the second bit line when reading data from the memory cell.

5. The device according to claim 4, wherein the first sense amplifier further includes a first MOS transistor of a first conductivity type which has one end of a current path connected to a power supply potential, a second MOS transistor of the first conductivity type which has one end of a current path connected to the power supply potential and which has a gate connected to another end of the current path and to a gate of the first MOS transistor and which, together with the first MOS transistor, forms a current mirror circuit, and a third MOS transistor of a second conductivity type which has a gate connected to another end of the current path of the first MOS transistor and which has one end of a current path connected to the gates of the first and second MOS transistors, the first current source includes a fourth MOS transistor of the second conductivity type which has one end of a current path connected to the another end of the current path of the first MOS transistor and which has a gate connected to the first bit line, and the second current source includes a fifth MOS transistor of the second conductivity type which has one end of a current path connected to the another end of the current path of the second MOS transistor and which has a gate connected to the second bit line.

6. The device according to claim 2, further comprising a word line which connects commonly the memory cells in the same row;

a row decoder which selects the word line; and a sense amplifier decoder which generates a sense amplifier activate signal activating the sense amplifier and a switch control signal carrying out on/off control of the switch element, wherein the row decoder and the sense amplifier decoder are arranged so as to face each other in a direction along the word line, with the memory cell array being sandwiched between the row decoder and the sense amplifier decoder.

7. The device according to claim 2, wherein each of the memory cells includes a memory cell transistor which has a stacked gate including a charge accumulation layer and a control gate formed on the charge accumulation layer with an inter-gate insulating film interposed therebetween and which has a drain connected to the bit line, and a select transistor which has a drain connected to a source of the memory cell transistor.

8. The device according to claim 7, further comprising:

a word line which connects commonly the control gates of the memory cell transistors included in the memory cells in the same row;

a select gate line which connects commonly the gates of the select transistors included in the memory cells in the same row;

a first row decoder which selects the word line; and a second row decoder which selects the select gate line.

9. The device according to claim 8, further comprising:

a sense amplifier decoder which generates a sense amplifier activate signal activating the sense amplifier and a switch control signal carrying out on/off control of the switch element, wherein the second row decoder and the first row decoder and sense amplifier decoder are arranged so as to face one other in a direction along the word line, with the memory cell array being sandwiched between the second row decoder and the remaining two decoders.

10. The device according to claim 1, wherein each of the memory cells includes a memory cell transistor which has a stacked gate including a charge accumulation layer and a control gate formed on the charge accumulation layer with an inter-gate insulating film interposed therebetween and which has a drain connected to the bit line, and a select transistor which has a drain connected to a source of the memory cell transistor and which has a source connected commonly to two of more of the memory cells.

11. A semiconductor memory device comprising:

a memory cell array in which memory cells are arranged;

a bit line which connects commonly the memory cells in the same column;

a precharge circuit which applies a precharge potential to the bit line in reading data; and a first sense amplifier which amplifies data read onto the bit line, the first sense amplifier including a first current source which is connected to the bit line and supplies a current according to the potential of the bit line, a switch element which connects the bit line and the precharge circuit, and a second current source which is connected via the switch element to the bit line and supplies a current according to the potential of the bit line.

12. The device according to claim 11, wherein each of the memory cells includes a memory cell transistor which has a stacked gate including a charge accumulation layer and a control gate formed on the charge accumulation layer with an inter-gate insulating film interposed therebetween and which has a drain connected to the bit line, and a select transistor which has a drain connected to a source of the memory cell transistor.

13. The device according to claim 11, further comprising a second sense amplifier,
wherein the bit line includes
first bit lines each of which connects commonly the memory cells in the same column, and
a second bit line which connects commonly two or more of the first bit lines via the switch element.

14. The device according to claim 11, further comprising
a word line which connects commonly the memory cells in the same row;
a row decoder which selects the word line; and
a sense amplifier decoder which generates a sense amplifier activate signal activating the sense amplifier and a switch control signal carrying out on/off control of the switch element.

15. The device according to claim 14, further comprising a second sense amplifier,
wherein the bit line includes
first bit lines each of which connects commonly the memory cells in the same column, and
a second bit line which connects commonly two or more of the first bit lines via the switch element.

16. The device according to claim 15, wherein each of the memory cells includes
a memory cell transistor which has a stacked gate including a charge accumulation layer and a control gate formed on the charge accumulation layer with an inter-gate insulating film interposed therebetween and which has a drain connected to the bit line, and
a select transistor which has a drain connected to a source of the memory cell transistor.

17. A method of reading data in a semiconductor memory device, comprising:
connecting a first bit line and a second bit line to each other with a switch element;
precharging the first and second bit lines with a precharge circuit, the precharge circuit being connected to the second bit line via the first bit line and the switch element;
after the precharging, connecting the first and second bit lines to each other with the switch element to equalize the potentials of the first and second bit lines;
disconnecting the first and second bit lines from each other with the switch element;
reading data from a memory cell onto the second bit line, with the first and second bit lines being disconnected; and
after reading the data, amplifying the potential of the second bit line using the potential of the first bit line as a reference.

18. The method according to claim 17, wherein the first bit line is in a floating state at its precharged potential when the potential of the second bit line is amplified.

* * * * *